· US009355839B2

(12) United States Patent
Swaminathan et al.

(10) Patent No.: US 9,355,839 B2
(45) Date of Patent: May 31, 2016

(54) SUB-SATURATED ATOMIC LAYER DEPOSITION AND CONFORMAL FILM DEPOSITION

(71) Applicant: Lam Research Corporation, Fremont, CA (US)

(72) Inventors: Shankar Swaminathan, Hillsboro, OR (US); Hu Kang, Tualatin, OR (US); Adrien Lavoie, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 28 days.

(21) Appl. No.: 14/061,587

(22) Filed: Oct. 23, 2013

(65) Prior Publication Data

US 2014/0120737 A1 May 1, 2014

Related U.S. Application Data

(60) Provisional application No. 61/717,576, filed on Oct. 23, 2012.

(51) Int. Cl.
*H01L 21/02* (2006.01)
*C23C 16/455* (2006.01)
*H01L 21/311* (2006.01)

(52) U.S. Cl.
CPC ........ *H01L 21/0228* (2013.01); *C23C 16/4554* (2013.01); *C23C 16/45527* (2013.01); *H01L 21/02164* (2013.01); *H01L 21/02219* (2013.01);
(Continued)

(58) Field of Classification Search
CPC ............ H01L 21/28202; H01L 29/518; H01L 21/02255; H01L 21/28211; H01L 29/513; H01J 37/32192; H01J 37/3244; H01J 37/32623; H01J 37/321; C23C 16/4401; C23C 16/45565; C23C 16/452; C23C 16/517
See application file for complete search history.

(56) References Cited

U.S. PATENT DOCUMENTS

| 4,500,563 A | 2/1985 | Ellenberger et al. |
| 5,223,443 A | 6/1993 | Chinn et al. |
| 5,496,608 A | 3/1996 | Matsuda et al. |

(Continued)

FOREIGN PATENT DOCUMENTS

| CN | 101416293 A | 4/2009 |
| CN | 101535524 A | 9/2009 |

(Continued)

OTHER PUBLICATIONS

U.S. Appl. No. 13/963,212, filed Aug. 9, 2013, entitled "Plasma-Activated Deposition of Conformal Films".

(Continued)

*Primary Examiner* — Michelle Mandala
(74) *Attorney, Agent, or Firm* — Weaver Austin Villeneuve & Sampson LLP

(57) ABSTRACT

Methods and apparatus for depositing continuous thin films using plasma-activated sub-saturated atomic layer deposition are provided herein. According to various embodiments, pin-hole free continuous films may be deposited at thicknesses thinner than achievable with conventional methods. The methods and apparatus also provide high degree of thickness control, with films a per-cycle thickness tunable to as low as 0.1 Å in some embodiments. Further, the methods and apparatus may be used to provide films having improved properties, such as lower wet etch rate, in some embodiments.

22 Claims, 13 Drawing Sheets

(52) U.S. Cl.
CPC ..... *H01L 21/02274* (2013.01); *H01L 21/31111* (2013.01)

(56) References Cited

U.S. PATENT DOCUMENTS

| | | | |
|---|---|---|---|
| 5,593,914 A | 1/1997 | Evans, Jr. et al. |
| 5,670,432 A | 9/1997 | Tsai |
| 5,856,003 A | 1/1999 | Chiu |
| 5,874,368 A | 2/1999 | Laxman et al. |
| 5,932,286 A | 8/1999 | Beinglass et al. |
| 6,270,572 B1 | 8/2001 | Kim et al. |
| 6,346,741 B1 | 2/2002 | Van Buskirk et al. |
| 6,391,803 B1 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,509,601 B1 | 1/2003 | Lee et al. |
| 6,528,430 B2 | 3/2003 | Kwan et al. |
| 6,551,893 B1 | 4/2003 | Zheng et al. |
| 6,576,053 B1 | 6/2003 | Kim et al. |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic et al. |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,109,129 B1 | 9/2006 | Papasouliotis |
| 7,115,528 B2 | 10/2006 | Vaartstra et al. |
| 7,122,222 B2 | 10/2006 | Xiao et al. |
| 7,122,464 B2 | 10/2006 | Vaarstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,235,484 B2 | 6/2007 | Nguyen et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,758,920 B2 | 7/2010 | Hasebe et al. |
| 7,776,733 B2 | 8/2010 | Hasegawa |
| 7,825,039 B2 | 11/2010 | Takahashi et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,956,983 B2 | 2/2015 | Swaminathan et al. |
| 8,999,859 B2 | 4/2015 | Swaminathan et al. |
| 9,076,646 B2 | 7/2015 | Sims et al. |
| 2002/0076507 A1 | 6/2002 | Chiang et al. |
| 2003/0008070 A1 | 1/2003 | Seutter et al. |
| 2003/0024477 A1 | 2/2003 | Okuda et al. |
| 2003/0200917 A1 | 10/2003 | Vaartstra |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0219746 A1 | 11/2004 | Vaartstra et al. |
| 2004/0231799 A1 | 11/2004 | Lee et al. |
| 2005/0042865 A1 | 2/2005 | Cabral et al. |
| 2005/0079661 A1 | 4/2005 | Cho et al. |

(56) References Cited

U.S. PATENT DOCUMENTS

| | | |
|---|---|---|
| 2005/0109276 A1 | 5/2005 | Iyer et al. |
| 2005/0118837 A1 | 6/2005 | Todd et al. |
| 2005/0159017 A1 | 7/2005 | Kim et al. |
| 2005/0181535 A1 | 8/2005 | Yun et al. |
| 2005/0196977 A1 | 9/2005 | Saito et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0287775 A1 | 12/2005 | Hasebe et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0199357 A1 | 9/2006 | Wan et al. |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0065576 A1 | 3/2007 | Singh et al. |
| 2007/0134942 A1 | 6/2007 | Ahn et al. |
| 2007/0137572 A1 | 6/2007 | Matsuura et al. |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0251444 A1 | 11/2007 | Gros et al. |
| 2007/0259110 A1 | 11/2007 | Mahajani et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0087890 A1 | 4/2008 | Ahn et al. |
| 2008/0123394 A1 | 5/2008 | Lee et al. |
| 2008/0131601 A1* | 6/2008 | Kim et al. ............. 427/255.28 |
| 2008/0139003 A1 | 6/2008 | Pirzada et al. |
| 2008/0213479 A1 | 9/2008 | Chou et al. |
| 2008/0242116 A1 | 10/2008 | Clark |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0096688 A1 | 4/2010 | Balseanu et al. |
| 2010/0099236 A1 | 4/2010 | Kwon et al. |
| 2010/0102417 A1 | 4/2010 | Ganguli et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0167555 A1 | 7/2010 | Maula et al. |
| 2010/0221925 A1 | 9/2010 | Lee et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0064969 A1 | 3/2011 | Chen et al. |
| 2011/0086516 A1 | 4/2011 | Lee et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1 | 3/2012 | Li et al. |
| 2012/0108079 A1 | 5/2012 | Mahajani |
| 2012/0113672 A1 | 5/2012 | Dubrow et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0058161 A1 | 3/2013 | Yamanaka et al. |
| 2013/0058162 A1 | 3/2013 | Yamanaka et al. |
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0309415 A1 | 11/2013 | Swaminathan et al. |
| 2013/0319329 A1 | 12/2013 | Li et al. |
| 2014/0030444 A1 | 1/2014 | Swaminathan et al. |
| 2014/0051262 A9 | 2/2014 | Lavoie et al. |
| 2014/0106574 A1 | 4/2014 | Kang et al. |
| 2014/0113457 A1 | 4/2014 | Sims et al. |
| 2014/0120270 A1* | 5/2014 | Tour et al. ..................... 427/596 |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0264555 A1 | 9/2014 | Ahn et al. |
| 2014/0302686 A1 | 10/2014 | Pan et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |

FOREIGN PATENT DOCUMENTS

| | | | |
|---|---|---|---|
| CN | 101889331 A | 11/2010 | |
| EP | 0 277 766 | 8/1988 | |
| EP | 0 541 212 | 5/1993 | |
| EP | 1703552 A2 * | 9/2006 | ............ H01L 21/314 |
| EP | 2 278 046 | 1/2011 | |
| JP | 4364320 | 8/2009 | |
| JP | 2010-10497 | 1/2010 | |
| KR | 10-2001-0111448 | 12/2001 | |
| KR | 10-2004-0001036 | 1/2004 | |
| KR | 10-2009-0057665 | 6/2009 | |
| KR | 10-2009-0080019 | 7/2009 | |
| KR | 10-2009-0081396 | 7/2009 | |
| TW | 201009942 (A) | 3/2010 | |
| WO | WO 2006/026350 | 3/2006 | |
| WO | WO 2006/104741 | 10/2006 | |
| WO | WO 2007/118026 | 10/2007 | |
| WO | WO 2011/130326 | 10/2011 | |
| WO | WO 2011/130397 | 10/2011 | |
| WO | WO 2012/040317 | 3/2012 | |
| WO | WO 2012/048094 | 4/2012 | |
| WO | WO 2012/087737 | 6/2012 | |

(56) References Cited

FOREIGN PATENT DOCUMENTS

| WO | WO 2013/032786 | 3/2013 |
|---|---|---|
| WO | WO 2013/043330 | 3/2013 |
| WO | WO 2013/112727 | 8/2013 |

OTHER PUBLICATIONS

U.S. Appl. No. 13/953,616, filed Jul. 29, 2013, entitled "High Pressure, High Power Plasma Activated Conformal Film Deposition".
US Office Action dated Mar. 15, 2013 issued in U.S. Appl. No. 13/084,399.
US Final Office Action dated Sep. 13, 2013 issued in U.S. Appl. No. 13/084,399.
US Office Action dated Sep. 14, 2012 issued in U.S. Appl. No. 13/084,305.
US Final Office Action dated Apr. 25, 2013 issued in U.S. Appl. No. 13/084,305.
US Office Action dated Apr. 13, 2011 issued in U.S. Appl. No. 12/889,132.
US Notice of Allowance dated Sep. 30, 2011 issued in U.S. Appl. No. 12/889,132.
US Office Action dated Aug. 1, 2012 issued in U.S. Appl. No. 13/011,569.
US Final Office Action dated Feb. 26, 2013 issued in U.S. Appl. No. 13/011,569.
US Notice of Allowance dated May 6, 2013 issued in U.S. Appl. No. 13/011,569.
US Office Action dated Apr. 4, 2013 issued U.S. Appl. No. 13/242,084.
US Notice of Allowance dated Jun. 19, 2013 issued U.S. Appl. No. 13/242,084.
US Notice of Allowance dated Sep. 19, 2013 issued U.S. Appl. No. 13/242,084.
US Office Action dated Apr. 29, 2013 issued U.S. Appl. No. 13/224,240.
US Office Action dated Jun. 7, 2013 issued U.S. Appl. No. 13/414,619.
US Notice of Allowance dated Jul. 26, 2013, issued U.S. Appl. No. 13/414,619.
US Office Action dated May 24, 2013 issued U.S. Appl. No. 13/472,282.
US Notice of Allowance dated Oct. 4, 2013 issued U.S. Appl. No. 13/472,282.
PCT International Search Report and Written Opinion, dated Oct. 20, 2011, issued in PCT/US2011/032186.
PCT International Preliminary Report on Patentability dated Oct. 26, 2012, issued in PCT/US2011/032186.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
PCT International Search Report and Written Opinion dated Dec. 18, 2012, issued in Application No. PCT/US2012/052769.
PCT International Search Report and Written Opinion dated Feb. 28, 2013, issued in Application No. PCT/US2012/051740.
PCT International Search Report and Written Opinion dated May 27, 2013, issued in Application No. PCT/US2013/022977.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
King, Sean W., (Jul./Aug. 2011) "Plasma enhanced atomic layer deposition of $SiN_x$:H and $SiO_2$," *J. Vac. Sci. Technol.* A29(4):9 pages.

Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju, (2005) "Low-impurity, highly conformal atomic layer deposition of titanium nitride using $NH_3$—Ar—$H_2$ plasma treatment for capacitor electrodes," *Materials Letters*, 59:615-617.
Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.
Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.
Plasma Enhanced Atomic Layer Deposition (PEALD), Website: http://www.asm.com/index.php?option=com_content&task=view&id=19&Itemid=161 (2010), 1 page.
PlasmaPro™, NGP® 80 Range, Next Generation Plasma Systems, *Oxford Instruments* (2010), 8 pages.
U.S. Appl. No. 14/335,785, filed Jul. 18, 2014, entitled "Methods for Depositing Silicon Oxide."
U.S. Appl. No. 14/552,011, filed Nov. 24, 2014, entitled "Selective Inhibition in Atomic Layer Deposition of Silicon-Containing Films."
U.S. Appl. No. 14/678,736, filed Apr. 3, 2015, entitled "Deposition of Conformal Films by Atomic Layer Deposition and Atomic Layer Etch."
US Notice of Allowance dated Jan. 15, 2014 issued in U.S. Appl. No. 13/084,399.
US Office Action dated Jan. 2, 2015 issued in U.S. Appl. No. 14/231,554.
US Final Office Action dated Jun. 10, 2015 issued in U.S. Appl. No. 14/231,554.
US Notice of Allowance dated Aug. 31, 2015 issued in U.S. Appl. No. 14/231,554.
US Office Action dated Sep. 21, 2015 issued U.S. Appl. No. 14/607,997.
US Notice of Allowance dated Aug. 7, 2014 issued U.S. Appl. No. 14/133,239.
US Notice of Allowance dated Nov. 26, 2014 issued U.S. Appl. No. 14/133,239.
US Final Office Action dated Nov. 22, 2013 issued U.S. Appl. No. 13/224,240.
US Examiner's Answer to Appeal Brief (filed May 22, 2014) Before the Patent Trial and Appeal Board dated Aug. 14, 2014 issued U.S. Appl. No. 13/224,240.
US Office Action dated May 21, 2014 issued in U.S. Appl. No. 13/607,386.
US Notice of Allowance dated Oct. 8, 2014 issued in U.S. Appl. No. 13/607,386.
US Notice of Allowance dated Nov. 19, 2014 issued in U.S. Appl. No. 13/607,386.
US Office Action dated Jun. 13, 2014 issued in U.S. Appl. No. 13/953,616.
US Final Office Action dated Nov. 24, 2014 issued in U.S. Appl. No. 13/953,616.
US Office Action dated Dec. 11, 2014 issued in U.S. Appl. No. 14/074,596.
US Office Action dated May 15, 2015 issued in U.S. Appl. No. 14/074,617.
US Office Action dated Mar. 2, 2015 issued in U.S. Appl. No. 14/137,860.
US Notice of Allowance dated Oct. 1, 2015 issued in U.S. Appl. No. 14/137,860.
US Notice of Allowance [Supplemental Notice of Allowability] dated Oct. 22, 2015 issued in U.S. Appl. No. 14/137,860.
US Office Action dated Jul. 10, 2014 issued in U.S. Appl. No. 14/144,107.
US Final Office Action dated Jan. 15, 2015 issued in U.S. Appl. No. 14/144,107.
US Notice of Allowance dated Mar. 19, 2015 issued in U.S. Appl. No. 14/144,107.

(56) References Cited

OTHER PUBLICATIONS

US Office Action dated Oct. 21, 2015 issued in U.S. Appl. No. 14/194,549.
US Notice of Allowance dated Aug. 5, 2015 issued in U.S. Appl. No. 14/183,287.
US Office Action dated Jul. 2, 2015 issued in U.S. Appl. No. 14/187,145.
US Office Action dated Apr. 13, 2015 issued in U.S. Appl. No. 14/335,785.
Chinese First Office Action dated Jun. 2, 2015 issued in CN 201180045808.6.
PCT International Preliminary Report on Patentability and Written Opinion dated Apr. 3, 2014, issued in Application No. PCT/US2012/052769.
PCT International Preliminary Report on Patentability and Written Opinion dated Mar. 13, 2014, issued in Application No. PCT/US2012/051740.
Chinese First Office Action [no translation] dated Nov. 6, 2015 issued in CN 201280053888.4.
European Extended Search Report dated Apr. 14, 2014 issued in EP 13 15 2046.
Korean Notice of Provisional Rejection dated Dec. 6, 2013 issued in KR 10-2012-0043797.
Korean Final Office Action dated Aug. 18, 2014 issued in KR 10-2012-0043797.
Korean Trial Decision (English description) dated May 25, 2015 issued in KR 10-2012-0043797.
PCT International Preliminary Report on Patentability and Written Opinion dated Aug. 7, 2014, issued in Application No. PCT/US2013/022977.
Cecchi et al., (2007) "Ultra-thin conformal pore-sealing of low-k materials by plasma-assisted ALD," *University of New Mexico*, Albuquerque, NM, *Sandia National Labs*, Albuquerque, NM, 1 page.
Hausmann et al. (2002) "Atomic Layer Deposition of Hafnium and Zirconium Oxides Using Metal Amide Precursors," *Chem. Mater.* 14(10):4350-4358.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lavareda et al., (2004) "Properties of a-Si:H TFTs using silicon carbonitride as dielectric," *Journal of Non-Crystalline Solids*, 338-340:797-801.
Li, Xingcun, et al., (2011) "Atomic Layer Deposition $Al_2O_3$ Thin Films in Magnetized Radio Frequency Plasma Source," *Physics Procedia* 18:100-106.
Puurunen, Riikka L. (2005) "Surface chemistry of atomic layer deposition: A case study for the trimethylaluminum/water process," *Journal of Applied Physics*, 97:121301-1-121301-52.
van der Straten et al. (2004) "Atomic layer deposition of tantalum nitride for ultrathin liner applications in advanced copper metallization schemes," *Journal of Materials Research*, 19(2):447-453.
U.S. Appl. No. 14/987,542, filed Jan. 4, 2016, entitled "Gapfill of Variable Aspect Ratio Features With a Composite PEALD and PECVD Method".
U.S. Appl. No. 14/932,869, filed Nov. 4, 2015, entitled "High Growth Rate Process for Conformal Aluminum Nitride."
US Office Action dated Dec. 24, 2015 issued in U.S. Appl. No. 14/074,596.
US Notice of Allowance dated Nov. 20, 2015 issued in U.S. Appl. No. 14/074,617.
US Final Office Action dated Dec. 16, 2015 issued in U.S. Appl. No. 14/187,145.
Chinese First Office Action dated Nov. 19, 2015 issued in CN 201280046487.6.
Taiwan Notice of Allowance and Search Report dated Dec. 18, 2015 issued in TW 101134692.

\* cited by examiner

SUB-SATURATED ATOMIC LAYER DEPOSITION AND CONFORMAL FILM DEPOSITION

CROSS-REFERENCE TO RELATED APPLICATION

This application claims benefit of U.S. Provisional Patent Application No. 61/717,576, filed Oct. 23, 2012, and titled "SUB-SATURATED ATOMIC LAYER DEPOSITION AND CONFORMAL FILM DEPOSITION," which is incorporated by reference herein in its entirety and for all purposes.

BACKGROUND

Atomic layer deposition (ALD) processes may be used to deposit various thin film layers for fabrication of semiconductor devices. In conventional CFD processing, each half-reaction involves saturation. Under some conditions, some ALD result in incomplete film deposition on the wafer, film islanding and film thickness variation. Some approaches to address incomplete film deposition may include overdosing by using longer dosing times to saturate the wafer surface with film precursor. However, extended dosing time may waste valuable precursor during film nucleation phases. The additive effect of extending processing time may diminish process tool throughput, requiring the installation and maintenance of additional process tools to support a production line. Films produced by such approaches may also have physical, chemical, or electrical characteristics that provide inadequate device performance.

SUMMARY

Methods and apparatus for depositing a film on a substrate surface are described herein. The methods involve plasma-activated surface-mediated reactions whereby film is grown over multiple cycles of reactant adsorption and reaction. According to various embodiments, the methods described herein involve multiple cycles of dosing a first reactant at levels to under-saturate a surface on the substrate forming a sub-saturated layer, followed by plasma activation of the sub-saturated layer to form a sub-monolayer of the film.

In one aspect, a method of depositing a film on a substrate surface is provided. According to various embodiments, a substrate is provided in a reaction chamber. A first reactant is introduced in vapor phase into the reaction chamber under conditions allowing the first reactant to adsorb onto the surface. In various embodiments, a second reactant is introduced in a sub-saturated dose in vapor phase into the reaction chamber for a dose time. In many embodiments, the substrate is periodically exposed to plasma when the dose of the second reactant has ceased to drive a surface reaction between the first and second reactants on the substrate surface to form a film.

In some embodiments, the plasma is ignited while at least one of the reactants is in a gas phase while being exposed to the substrate. In various embodiments, the deposition temperature is less than about 200° C. In some embodiments, the deposition temperature is less than about 150° C.

In various embodiments, the plasma exposure has a conversion efficiency of at least 50 J/mL where conversion efficiency is the amount of plasma energy applied per unit of second reactant flux in the sub-saturated dose. In some embodiments, the conversion efficiency is at least 150 J/mL. According to some embodiments, the first reactant is an oxidant. In many embodiments, a saturated dose of the second reactant is determined via a dose saturation curve prior to introducing the dose of the second reactant. In various embodiments, the sub-saturated dose is less than about 4 microliters of the second reactant. In some embodiments, the sub-saturated dose is less than about 60% of a saturated dose.

According to some embodiments, residual second reactant in vapor phase is purged out for a purge time prior to exposing the substrate to plasma, for a purge time to sub-saturated dose time ratio of less than about 2. In various embodiments, the second reactant is a precursor molecule with a surrounding atom molecular weight of at least 50 Da. In some embodiments, the second reactant is a precursor molecule with a surrounding atom molecular weight of at least 140 Da.

According to various embodiments, the film deposited is less than about 0.5 Å thick. In some embodiments, the film deposited is less than about 0.1 Å thick. In many embodiments, the deposited film has a within wafer non-uniformity of less than 1.0%.

In another aspect, a method for depositing a film on a substrate surface is provided. The substrate is provided in a station of a single or multi-station reaction chamber. In many embodiments, a first reactant in vapor phase is introduced into the chamber under conditions allowing the first reactant to adsorb onto the substrate surface. In various embodiments, a dose of a second reactant in vapor phase is then introduced into the reaction chamber wherein the dose of the second reactant is a sub-saturated dose. In many embodiments, the substrate surface is periodically exposed to plasma when the dose of the second reactant has ceased to drive a surface reaction between the first and second reactants on the substrate surface to form the film. In many embodiments, the plasma generated has an energy of at least about 200 Joules per chamber.

In many embodiments, the deposition temperature is less than about 150° C. In various embodiments, the dose of the second reactant is determined via a dose saturation curve prior to introducing the dose of the second reactant. According to some embodiments, the plasma exposure has a conversion efficiency of at least 50 J/mL. In many embodiments, the film deposited is less than about 0.1 Å thick.

Another aspect relates to an apparatus configured to process a semiconductor substrate. According to various embodiments, the apparatus includes a reaction chamber, an inlet port for delivering gas phase reactants to the reaction chamber, a plasma generator for providing plasma to the reaction chamber, and a controller. The controller is configured to control the operations in the apparatus and includes machine readable instructions for: flowing a first reactant in vapor phase into the reaction chamber under conditions allowing the first reactant to adsorb onto the substrate surface, flowing a dose of a second reactant in vapor phase into the reaction chamber for a dose time wherein the dose of the second reactant is a sub-saturated dose, periodically supplying a plasma into the reaction chamber at a conversion efficiency of at least 50 J/mL when the dose of the second reactant has ceased to drive a surface reaction between the first and second reactants on the substrate surface to form the film.

These and other aspects are described further below with reference to the drawings.

DETAILED DESCRIPTION

Figure 1:
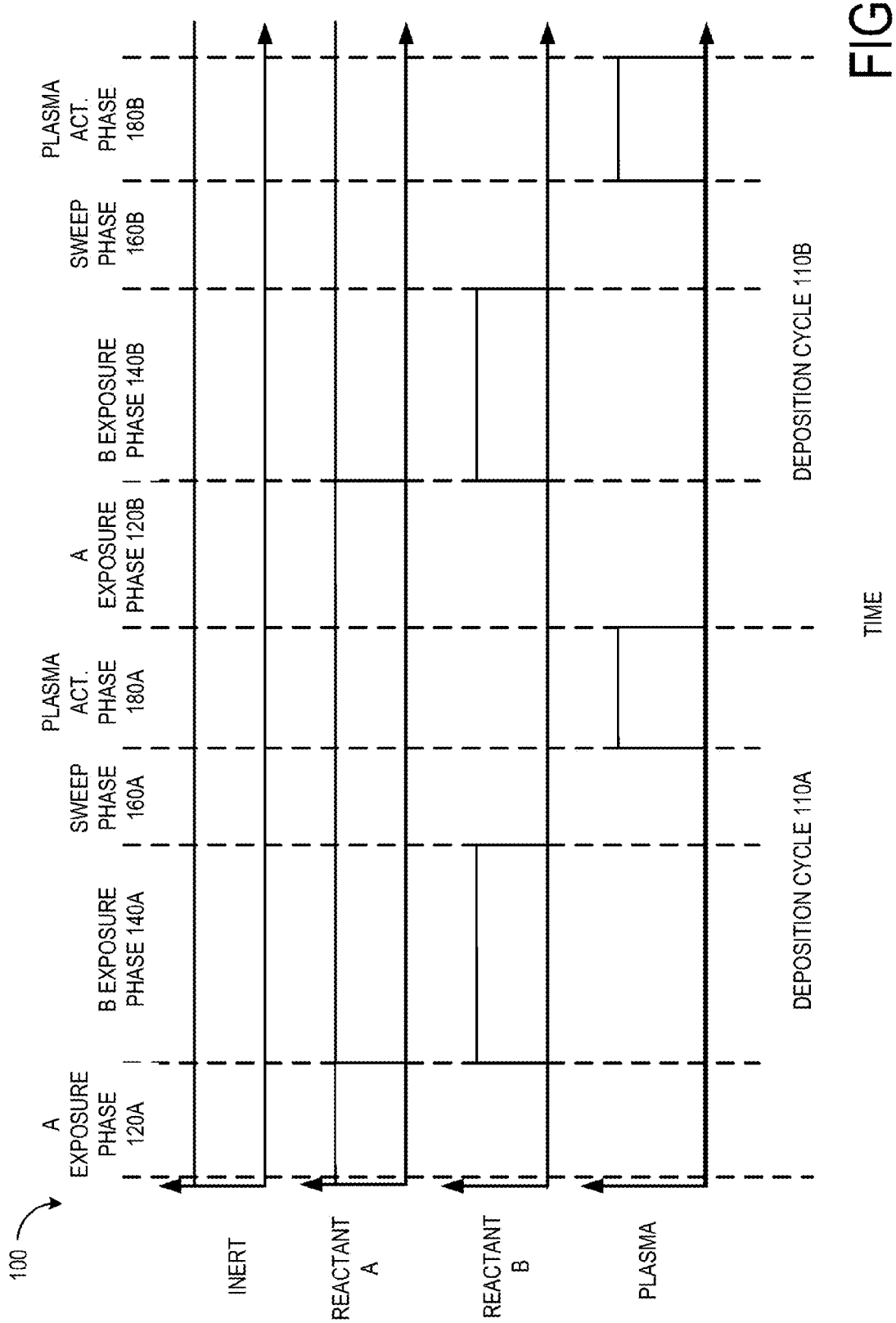
FIG. 1 schematically shows a timing diagram for an example plasma-activated sub-saturated atomic layer deposition (SS-ALD) process according to disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Manufacture of semiconductor devices typically involves depositing one or more thin films on a non-planar substrate in an integrated fabrication process. In some aspects of the integrated process, it may be useful to deposit thin films that conform to substrate topography. For example, a silicon nitride film may be deposited on top of an elevated gate stack to act as a spacer layer for protecting lightly-doped source and drain regions from subsequent ion implantation processes.

Atomic layer deposition (ALD) processes use surface-mediated deposition reactions to deposit films on a layer-by-layer basis. For example, a substrate surface, including a population of surface reactive sites, may be exposed to a gas phase distribution of a first film precursor (P1). Some molecules of P1 may form a condensed phase atop the substrate surface, including chemisorbed species and physisorbed molecules of P1. The reactor is then evacuated to remove the gas phase and physisorbed P1 so that only chemisorbed species remain. A second film precursor (P2) is then introduced to the reactor such that some molecules of P2 adsorb to the substrate surface. The reactor may again be evacuated to remove unbound P2. Subsequently, thermal energy provided to the substrate activates surface reactions between adsorbed molecules of P1 and P2 to form a film layer. Finally, the reactor is evacuated to remove reaction byproducts and possible unreacted P1 and P2, ending the ALD cycle. Many ALD cycles may be used to build film thickness.

Conformal film deposition (CFD), or plasma-assisted ALD, may also be used to deposit films on a layer-by-layer basis. Methods of forming films using CFD are described in U.S. patent application Ser. No. 13/084,399, incorporated by reference herein. For context, a short description of CFD is provided.

A CFD cycle may be relevant to the discussion of various embodiments herein. Generally, a cycle is the minimum set of operations required to perform a surface deposition reaction one time. The result of one conventional CFD cycle is production of at least a partial film layer on a substrate surface. A conventional CFD cycle may include steps necessary to deliver and adsorb reactants to the substrate surface, then react those adsorbed reactants to form the partial layer of film. The cycle may also include ancillary steps, such as sweeping one or more of the reactants or byproducts, or treating the partial film as deposited. An example of a cycle may include the following operations: (1) delivery/adsorption of a dose of reactant A, (2) optional purge or sweep, (3) delivery/adsorption of reactant B, (4) optional purge or sweep, (5) plasma treatment to drive surface reaction of A and B to form a partial film layer on the surface. In conventional ALD and CFD processes, each half-reaction (dose and activation) involves saturation, such that the above operations (1) and (3) involve saturation, which is partially achieved by overdosing.

Many semiconductor processing technologies may require films of a specific thickness or films thinner than is the minimum amount of film deposited per cycle using conventional ALD and CFD methods. Depositing thinner films per cycle may permit deposition of any desired thickness. Moreover, semiconductor fabrication may require denser films with better properties, such as improved modulation of wet etch rate.

Provided herein are low-dose silicon-containing precursor processes for forming silicon-containing layers by conformal film deposition (CFD) using sub-saturation. Sub-saturation may be defined as injecting a dose of a reactant less than the typical dose used to achieve saturation, or less than the overdose amount used to achieve saturation by conventional ALD or CFD methods. For purposes of the disclosed embodiments, such methods of using sub-saturation are called "Sub-Saturated ALD" (SS-ALD) methods, where SS-ALD methods also includes sub-saturated CFD methods and plasma-enhanced PE-ALD methods.

Films deposited by SS-ALD methods may have the following features: (1) film thickness may be precisely modulated by depositing very thin sub-saturated layers per deposition cycle, in some cases the per cycle thickness being less than the largest bond length of the desired film; (2) in the aggregate, continuous thin films may be deposited; (3) deposited films may have improved properties, such as improved wet etch rate control; and (4) less precursor is used and throughput is increased such that sweep times are decreased or excluded. Undersaturation may be controlled by limiting the flow or dose of reactive species to the surface. Additional variables may include pressure, temperature, dose flow, dose time, and choice of reactive species.

FIG. 1 schematically shows a timing diagram 100 for an example embodiment of a plasma-activated SS-ALD process. Two full SS-ALD cycles are depicted. As shown, each includes an exposure of reactant A phase 120, directly followed by a sub-saturated exposure to reactant B phase 140, a sweep of reactant B phase 160 and finally a plasma activation phase 180. In the depicted embodiments, no sweep phase is performed after one reactant (reactant A) is delivered. In fact, this reactant flows continuously during the film deposition process. Thus, plasma is ignited while reactant A is in the gas phase. In the depicted embodiment, reactant gases A and B may co-exist in the gas phase without reacting. Accordingly, one or more of the process steps described in the SS-ALD process may be shortened or eliminated in this example SS-ALD process. For example, sweep steps after A Exposure Phases 120A and 120B may be eliminated.

FIG. 1 also shows an embodiment of a temporal progression of example SS-ALD phases for various SS-ALD process parameters. FIG. 1 depicts two example deposition cycles 110A and 110B, though it will be appreciated that any suitable number of deposition cycles may be included in an SS-ALD process to deposit a desired film thickness. Example SS-ALD process parameters include, but are not limited to, level of sub-saturation, plasma power and frequency, flow rates of inert and continuous-flow reactant species, substrate temperature and process station pressure.

An SS-ALD cycle typically contains an exposure phase for each reactant. During this "exposure" phase, a reactant is delivered to a process chamber to cause adsorption of the reactant on the substrate surface. Typically, at the beginning of an exposure phase, the substrate surface may not have any appreciable amount of the reactant adsorbed. In FIG. 1 at reactant A exposure phases 120A and 120B, reactant A is supplied at a controlled flow rate to a process station to react with reactive sites on the exposed surfaces of a substrate. Reactant A may be any suitable deposition reactant and in one example where an SS-ALD method is used to deposit a silicon oxide film, reactant A may be oxygen.

In the embodiment shown in FIG. 1, reactant A flows continuously throughout deposition cycles 110A and 110B. Reactants A and B are allowed to mingle in the gas phase of some embodiments of an SS-ALD process and generally there is a sub-saturated amount of reactant B in the gas phase at any one cycle. In some embodiments, reactants A and B are chosen so that they can co-exist in the gas phase without appreciably reacting with one another under conditions encountered in the chamber prior to application of plasma energy or activation of the surface reaction. In some cases, the reactants are chosen such that (1) a reaction between them is thermodynamically favorable (i.e., Gibb's free energy <0) and (2) the reaction has a sufficiently high activation energy that there is negligible reaction at the desired deposition temperature absent plasma activation.

While the embodiment shown in FIG. 1 depicts reactant A exposure phases 120A and B as having a constant flow rate, it will be appreciated that any suitable flow of reactant A, including a variable flow, may be employed within the scope of the present disclosure. Further, while FIG. 1 shows reactant A having a constant flow rate during the entire SS-ALD cycle (deposition cycle 110A), this need not be the case. For example, the flow rate of reactant A may decrease during B exposure phases 140A and 140B. This may increase the partial pressure of B and thereby increase the driving force of reactant B adsorbing on the substrate surface.

Optionally, reactant A exposure phase 120A includes a controlled flow rate of an inert gas. Example inert gases include, but are not limited to, nitrogen, argon and helium. The inert gas may be provided to assist with pressure and/or temperature control of the process station, evaporation of a liquid precursor, more rapid delivery of the precursor and/or as a sweep gas for removing process gases from the process station and/or process station plumbing.

At Reactant B exposure phase 140A of the embodiment shown in FIG. 1, reactant B is supplied at a controlled flow rate to the process station to react with reactive sites on the exposed substrate surface at a sub-saturated level. In one example silicon dioxide film, reactant B may be bis(tertiary-butylamino)silane ($SiH_2(NHC(CH_3)_3)_2$) (BTBAS). While the embodiment of FIG. 1 depicts reactant B exposure phase 140A as having a constant flow rate, it will be appreciated that any suitable flow of reactant B, including a variable flow, may be employed within the scope of the present disclosure. Further, it will be appreciated that reactant B exposure phase 140A may have any suitable duration. Optionally, reactant B exposure phase 140A may include a controlled flow of a suitable inert gas, which, as described above, may assist with pressure and/or temperature control of the process station, evaporation of a liquid precursor, more rapid delivery of the precursor and may prevent back-diffusion of process station gases.

Figure 2:
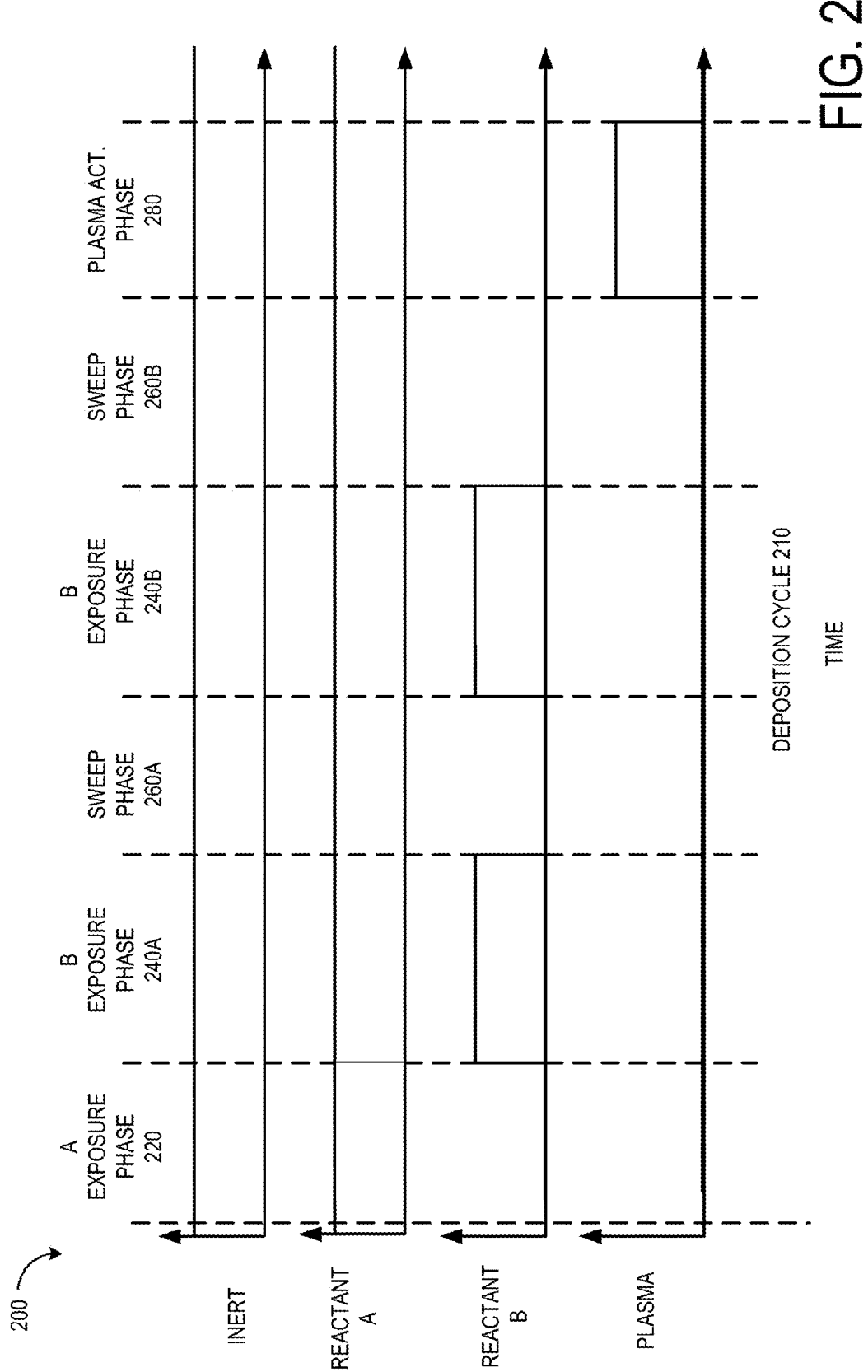
FIG. 2 schematically shows a timing diagram for another example plasma-activated SS-ALD process according to disclosed embodiments.

Additionally or alternatively, in some embodiments, one or more sweep phases may be included between consecutive exposures of reactant B. For example, the embodiment of FIG. 2 schematically shows an example SS-ALD process timing diagram 200 for a deposition cycle 210. At reactant B exposure phase 260A, a sub-saturation amount of reactant B is exposed to the substrate surface. Subsequently, at sweep phase 260A, reactant B is turned off, and gas phase species of reactant B are removed from the process station. In one scenario, gas phase reactant B may be displaced by a continuous flow of reactant A and/or the inert gas. In another scenario, gas phase reactant B may be removed by evacuating the process station. Removal of gas phase reactant B may shift an adsorption/desorption process equilibrium, desorbing ligands, promoting surface rearrangement of adsorbed B to merge discontinuous islands of adsorbed B. At reactant B exposure phase 260B, reactant B is again exposed to the substrate surface. While the embodiment shown in FIG. 2 includes one instance of a reactant B sweep and exposure cycle, it will be appreciated that any suitable number of iterations of alternating sweep and exposure cycles may be employed within the scope of the present disclosure.

Returning to the embodiment of FIG. 1, prior to activation by the plasma at 180A, gas phase reactant B may be removed from the process station in sweep phase 160A in some embodiments. An SS-ALD cycle may include one or more sweep phases in addition to the above-described exposure phases. Sweeping the process station may avoid gas phase reactions where reactant B is susceptible to plasma activation. Further, sweeping the process station may remove surface adsorbed ligands that may otherwise remain and contaminate the film. Examples sweep gases include, but are not limited to, argon, helium and nitrogen. In the embodiment shown in FIG. 1, sweep gas for sweep phase 160A is supplied by the inert gas stream. In some embodiments, sweep phase 160A may include one or more evacuation subphases for evacuating the process station. Alternatively, sweep phase 160A may be omitted in many embodiments.

Sweep phase 160A may have any suitable duration. In some embodiments, increasing a flow rate of a one or more sweep gases may decrease the duration of sweep phase 160A. For example, a sweep gas flow rate may be adjusted according to various reactant thermodynamic characteristics and/or geometric characteristics of the process station and/or process station plumbing for modifying the duration of sweep phase 160A. In one example, the sweep phase may be omitted. This may reduce deposition cycle time, which may improve substrate throughput.

An SS-ALD cycle generally includes an "activation phase" in addition to the exposure and optional sweep phases described above. The activation phase serves to drive the reaction of the one or more reactants adsorbed on the substrate surface. At plasma activation phase 180A of the embodiment shown in FIG. 1, plasma energy is provided to activate surface reactions between surface adsorbed reactants A and B. For example, the plasma may directly or indirectly activate gas phase molecules of reactant A to form reactant A radicals. These radicals may then interact with sub-saturated surface adsorbed reactant B, resulting in film-forming surface reactions. Plasma activation phase 180A concludes deposition cycle 110A, which in the embodiment of FIG. 1 is followed by deposition cycle 110B, commencing with reactant A exposure phase 120B.

In some embodiments, the plasma ignited in plasma activation phase 180A may be formed directly above the substrate surface. This may provide a greater plasma density and enhanced surface reaction rate between reactants A and B. For example, plasmas for SS-ALD processes may be generated by applying a radio frequency (RF) field to a low-pressure gas using two capacitively coupled plates. In alternative embodiments, a remotely generated plasma may be generated outside of the main reaction chamber.

Plasma activation phase 180A may have any suitable duration. In some embodiments, plasma activation phase 180A may have a duration that exceeds a time for plasma-activated radicals to interact with all exposed substrate surfaces and adsorbates, thereby eventually forming a continuous film atop the substrate surface.

While conventional CFD methods expose substrates to reactants such that the surface is saturated or oversaturated, provided herein are improved methods of depositing films that use reduced flows. Reduced flows have been found capable of yielding adequate saturation and deposition rates. In particular, it has been found that the plasma activation stages (e.g., stages 180A and 180B in FIG. 1 and stages 280A and 280B in FIG. 2) have greater conversion in some embodiments with SS-ALD than conventional CFD or plasma enhanced ALD methods. As described further below, this can provide films having improved properties.

Figure 3A:
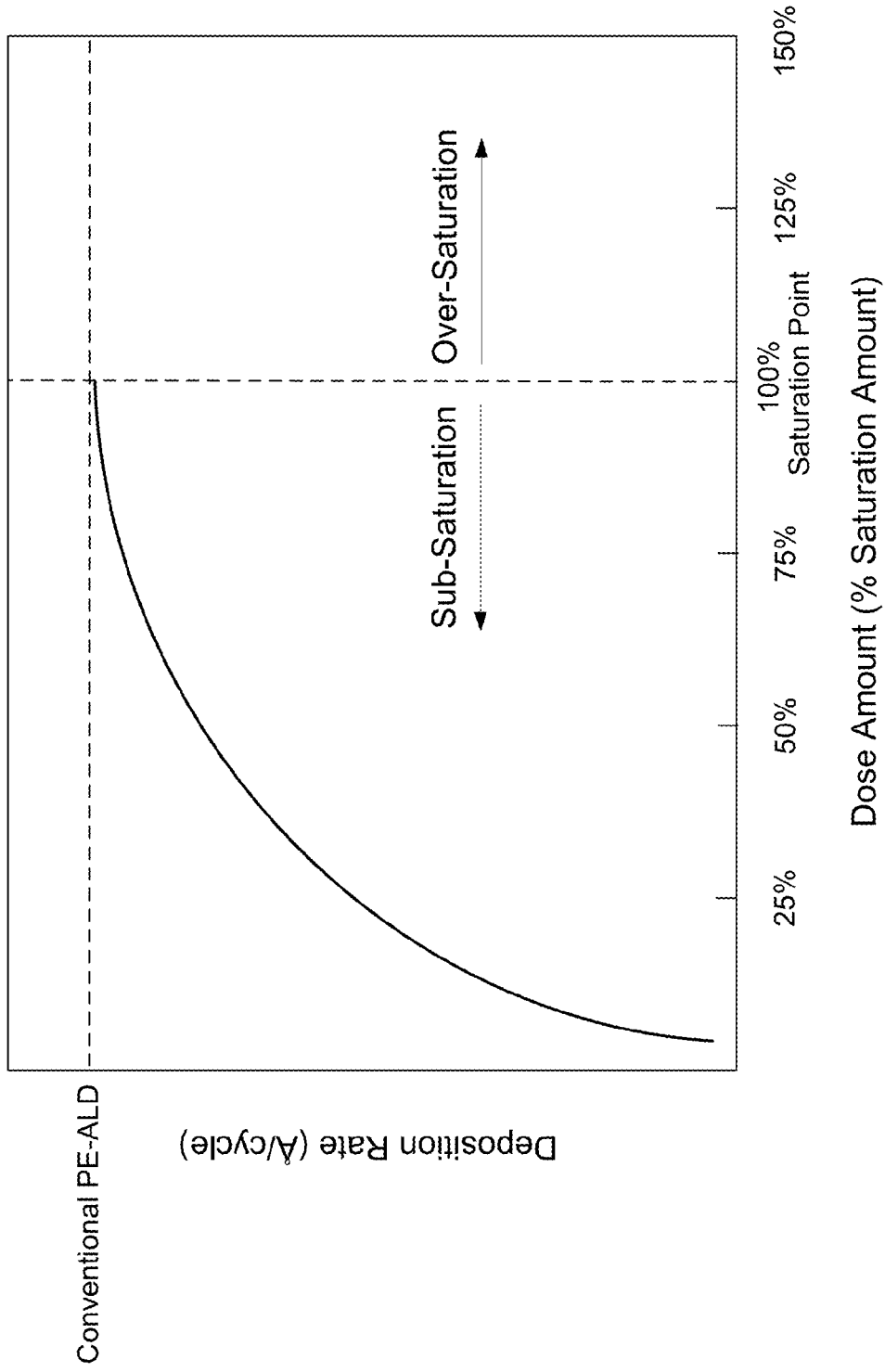
FIG. 3A shows an example of a dose saturation curve in accordance with various embodiments.

To initiate processing of a semiconductor wafer using SS-ALD methods, a selected sub-saturation dosage amount may be known. Such an amount may be determined by one of several methods. For example, a dose saturation curve may be used to determine the amount of precursor to use in each cycle of deposition by SS-ALD. A dose saturation curve may be obtained for any given precursor and process conditions. For example, in FIG. 3A, a general dose saturation curve is shown. For any given precursor, a curve such as the one shown in FIG. 3A indicates the relative deposition rate in Angstroms per cycle as dependent on the dose amount measured as a percent of the 100% saturation amount, where saturation amount is defined by the amount of precursor reactant required to completely cover the surface of a given wafer. The dose amount is typically measured by the flow rate and dose time. For example, dose amount may be measured as precursor flux in microliters of precursor per dose. This may be calculated by multiplying flow rate (mL/min) by dose time (seconds) and converting the amount to microliters to determine flux.

Conventional CFD methods typically use a dose amount of at least 100% of the saturation amount. Conventional methods also use over-saturation methods, or overdosing, such as 125% or 150% or even more. In embodiments provided herein, the dose amount may be any amount less than the 100% saturation point in the sub-saturation regime of FIG. 3A. For example, the dose amount may be 40% to 60% of the typical amount used for a precursor, such as BTBAS. In a specific example, a 0.5 mL/min flow rate of BTBAS may be used with 0.2-second doses for a 300 mm wafer in an SS-ALD process in accordance with the disclosed embodiments. For deposition using BTBAS on a 300 mm wafer, a precursor flux less than 4.0 microliters per dose may constitute sub-saturation.

Figure 3B:
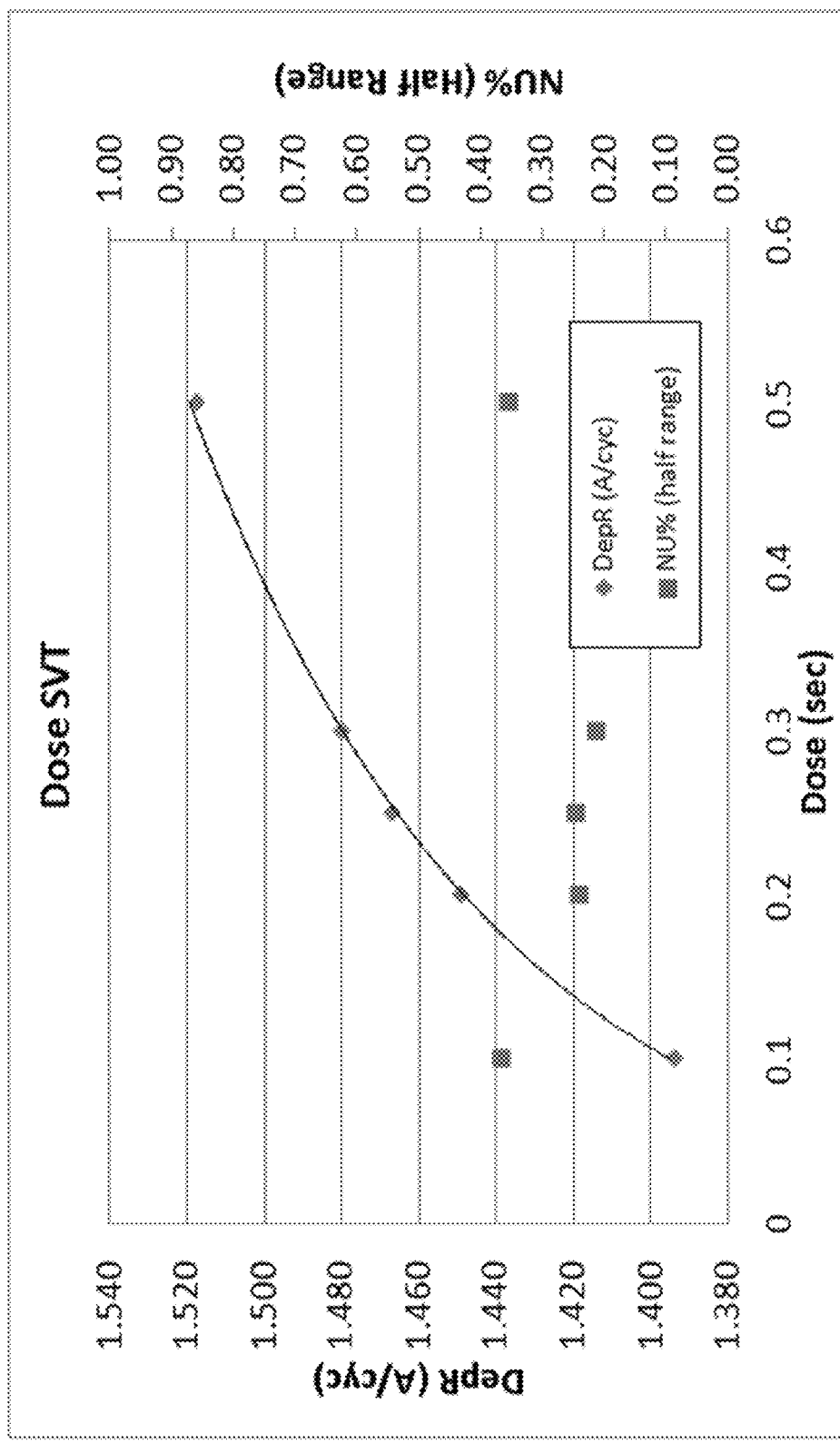
FIG. 3B shows data related to deposition rate and non-uniformity of silicon oxide films deposited using various dose times.

An example of a dose saturation curve obtained from experimental results is shown in FIG. 3B. Precursor dose of BTBAS in seconds is plotted against deposition rate in Å/cycle and is represented by the diamond-shaped points and connected curve. Deposition rate levels off at around 1.52 Å/cycle for a dose time of 0.5 seconds. Non-uniformity (NU %) is lowest at a 0.3 second dose time with a deposition rate of 1.480 Å/cycle. This may be a sub-saturated regime that may be used in accordance with disclosed embodiments.

An SS-ALD process may be employed to deposit any number of different types of film. Nitrides and oxides are featured dielectric materials, but carbides, oxynitrides, carbon-doped oxides, borides, etc. may also be formed. Oxides include a wide range of materials including undoped silicate glass (USG) and doped silicate glass. Examples of doped glasses include boron doped silicate glass (BSG), phosphorus doped silicate glass (PSG) and boron phosphorus doped silicate glass (BPSG). For example, an SS-ALD process may be used to deposit a silicon oxide film. The embodiments herein are not limited to particular reactants or film types.

Examples of reactants are provided. The description herein uses the terms "principal" and "auxiliary" reactants. As used herein, a principal reactant contains an element that is solid at room temperature, which element is contributed to the film formed by SS-ALD. Examples of such elements are metals (e.g., aluminum, titanium, etc.), semiconductors (e.g., silicon and germanium) and non-metals or metalloids (e.g., boron). As used herein, an auxiliary reactant is any reactant that is not a principal reactant. The term co-reactant is sometimes used to refer to auxiliary reactants. Examples of auxiliary reactants include oxygen, ozone, hydrogen, carbon monoxide, nitrous oxide, ammonia, alkyl amines and the like.

Any appropriate silicon-containing reactant and oxidant may be used for the deposition of silicon oxides. Similarly, for the deposition of silicon nitrides, any appropriate silicon-containing reactant and nitrogen-containing reactant may be used. Example flow rates are given for 300 mm wafers and may be scaled appropriately for wafers of other sizes. The silicon compound can be, for example, a silane, a halosilane or an aminosilane.

A silane contains hydrogen and/or carbon groups, but does not contain a halogen. Examples of silanes are silane ($SiH_4$), disilane ($Si_2H_6$) and particularly organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane and the like.

A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane and the like.

An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$, diisopropylaminosilane, bis(diethylamino)silane, tris(dimethylamino)silane (TDMAS), and the like. A further example of an aminosilane is trisilylamine ($N(SiH_3)_3$).

In other cases, the deposited film contains metal. Examples of metal-containing films that may be formed include oxides and nitrides of aluminum, titanium, hafnium, tantalum, tungsten, manganese, magnesium, strontium, etc., as well as elemental metal films. Example precursors may include metal alkylamines, metal alkoxides, metal alkylamides, metal halides, metal β-diketonates, metal carbonyls, organometallics, etc. Appropriate metal-containing precursors will include the metal that is desired to be incorporated into the film. For example, a tantalum-containing layer may be deposited by reacting pentakis(dimethylamido)tantalum with ammonia or another reducing agent as an auxiliary reactant. Further examples of metal-containing precursors that may be employed include trimethylaluminum, tetraethoxytitanium, tetrakis-dimethyl-amido titanium, hafnium tetrakis(ethylmethylamide), bis(cyclopentadienyl)manganese, and bis(n-propylcyclopentadienyl)magnesium, etc.

In some embodiments, the deposited film contains nitrogen, and a nitrogen-containing reactant is used. A nitrogen-containing reactant contains at least one nitrogen, for example, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

SS-ALD may be particularly suitable for depositing films using large precursor molecules. In many embodiments, the primary reactant includes a large functional group surrounding each metal or metalloid center. A large functional group may be defined by one or more of the following characteristics: the number of atoms surrounding each center, the number of bonds formed around a surrounding center, the molecular weight of the atoms surrounding a metal center, the inherent steric effects, such as the bulkiness of a tertiary group, or the van der Waal volume of the functional group. Each surrounding atom's van der Waal radii may be determined to evaluate the van der Waals volume, which is the volume occupied by an individual molecule. The van der Waals volume may also be determined b experimental measures using the van de Waals constant, polarizability, or molar refractivity.

A large functional group may have a molecular weight of surrounding atoms of at least about 50 Da (dalton or unified atomic mass unit), or at least about 100 Da, or at least about 150 Da. For example, BTBAS is a fairly large molecule with the atoms surrounding the single silicon atom, including two tert-butylamine ($NHC(CH_3)_3$) groups, with a total molecular weight of the surrounding atoms of about 146 Da.

Deposition by SS-ALD methods allows use of large precursors to deposit films. Without being bound by any particular theory, it is believed that steric hindrance in conventional ALD and CFD methods can prevent deposition of very thin, pinhole-free films because the ligands released on adsorption of a large precursor reactant molecule may block some reactive sites on the surface, thus preventing further adsorption of the precursor. In conventional ALD and CFD methods, in any one cycle, since the wafer is saturated with reactants, after the surface reactions occur, the reactive sites that were previously blocked are now made available, but are surrounded by more molecules already reacted to adjacent reactive sites.

By using an SS-ALD method as described herein, thinner pinhole-free films may be formed than with conventional methods. Without being bound by a particular theory, it is believed that the following mechanism may facilitate the deposition of these films using large precursors. First, less precursor is flowed into the reactive space such that a higher percentage of the precursor molecules can occupy the reactive sites in one cycle. Then, a fraction of the ligands may be released during plasma activation that further enhances the mobility of species on the surface, and previously blocked reactive sites may be available for the next cycle of large precursors to react at. In contrast with conventional ALD and CFD methods, in any one cycle, since the wafer is sub-saturated with precursor molecules, after the surface reactions occur, the remaining reactive sites that are now available for precursor molecules to react with are surrounded by less neighboring reacted molecules. This phenomenon increases the probability that precursor molecules introduced in the next cycle will react at these sites. Moreover, since each cycle is sub-saturated, there are less precursor molecules in the reactive space, and thus less competition between precursor molecules to react at any one given reactive site. Without being bound by a particular theory, it is believe that this results in a higher reactive site coverage during each sub-saturated dose exposure, thereby decreasing the probability of pinhole formation and increasing the density of the film. Thus, it may be possible to deposit even thinner, denser, and pinhole-free films that become uniform as SS-ALD cycles are operated over time.

In some embodiments, the reactant that flows continuously is an auxiliary reactant, such as an oxygen-containing oxidizing reactant. Auxiliary reactants may be flowed at super-saturated or saturated levels. Examples of oxygen-containing oxidizing reactants include oxygen, ozone, nitrous oxide, carbon monoxide, etc. While many examples discussed herein include two reactants (e.g., A and B, or a principal reactant and an auxiliary reactant), it will be appreciated that any suitable number of reactants may be employed within the scope of the present disclosure. In some embodiments, a single reactant and an inert gas used to supply plasma energy for a surface decomposition reaction of the reactant may be used. Alternatively, some embodiments may use three or more reactants to deposit a film.

The continuously flowing reactant may be provided at a constant flow rate or at varied but controlled flow rate. In the latter case, as an example, the flow rate of an auxiliary reactant may drop during an exposure phase when the primary reactant is delivered. For example, in oxide deposition, the oxidant may flow continuously during the entire deposition sequence, but its flow rate may drop when the primary reactant (e.g., BTBAS) is delivered. Shortly before igniting the plasma, the flow of oxidant may be increased to reduce the likelihood that BTBAS is present during the plasma exposure phase. In some embodiments, the continuously flowing reactant flows at a varied flow rate over the course of two or more deposition cycles. For example, the reactant may flow at a first flow rate during a first SS-ALD cycle and at a second flow rate during a second SS-ALD cycle.

As a specific example, an oxide film may be deposited by an SS-ALD process using a principal reactant such as bis(tert-butylamino)silane (BTBAS). In this example, the oxide deposition process involves delivery of an oxidant such as oxygen or nitrous oxide, which flows initially and continuously during delivery of the principal reactant in distinct exposure phases. The oxidant also continues to flow during distinct plasma exposure phases. See, for example, the sequence depicted in FIG. 1.

If multiple oxidant compounds are used, they can be mixed prior to delivery to the reaction chamber, or delivered as separate streams. In some embodiments, the oxidant is delivered continuously with an inert gas flow delivered in a burst for sweep or purge operations. In some embodiments, an inert gas flow may be continuous, with or without the inert gas flow rate increased for the purge operation. An optional sweep or purge can occur after the plasma is extinguished.

The concept of an SS-ALD "sweep" or "purge" step or phase appears in the discussion various embodiments herein. Generally, a sweep phase removes or purges one of the vapor phase reactant from a reaction chamber and typically occurs only after delivery of such reactant is completed. In other words, that reactant is no longer delivered to the reaction chamber during the sweep phase. However, the reactant remains adsorbed on the substrate surface during the sweep phase. Typically, the sweep serves to remove any residual vapor phase reactant in the chamber after the reactant is adsorbed on the substrate surface to the desired level. A sweep phase may also remove weakly adsorbed species (e.g., certain precursor ligands or reaction byproducts) from the substrate surface. In general, and unless otherwise specified herein, a sweep/purge phase may be accomplished by (i) evacuating a reaction chamber, and/or (ii) flowing gas not containing the species to be swept out through the reaction chamber. In the case of (ii), such gas may be, for example, an inert gas or an auxiliary reactant such as a continuously flowing auxiliary reactant.

Different embodiments may implement sweep phases at different times. For example, in certain cases a sweep step may occur at any of the following times: (1) after delivery of a principal reactant, (2) between pulses of delivering a principal reactant, (3) after delivery of an auxiliary reactant, (4) before plasma exposure, (5) after plasma exposure, and (6) any combination of (1)-(5). Some of these timeframes may overlap.

In many embodiments, the sweep step may be reduced substantially or omitted. During SS-ALD, a smaller amount of precursor or reactant is flowed into the reactive space, and thus there may be less residual vapor phase reactant in the chamber after the reactant is adsorbed on the substrate surface. As such, shorter sweep phases may be used without risking deposition by a vapor phase reaction.

Figure 4A:
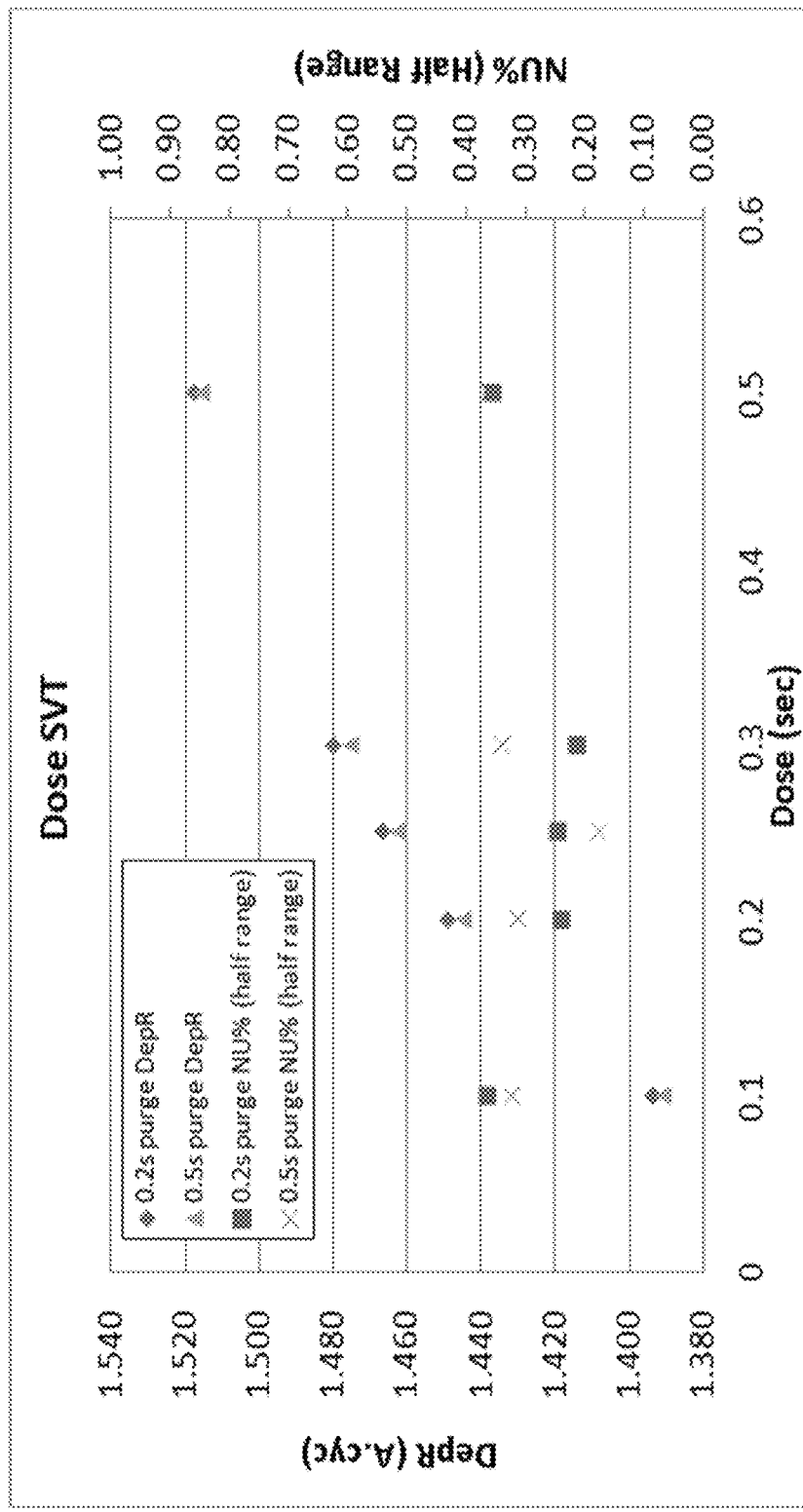
FIG. 4A shows data related to deposition rate and non-uniformity of silicon oxide films deposited using various dose times.

FIG. 4A shows deposition rate and non-uniformity at various dose times by SS-ALD for both a 0.2 second post-dose purge and a 0.5 second post-dose purge. As shown, the variation between the 0.2 second and 0.5 second post-dose purge times is not significantly different; thus, a 0.2 second post-dose purge time is sufficient for deposition processes. The minimized purge time suggests overall throughput may increase.

In some embodiments, a high frequency radio frequency (HFRF) plasma is employed. Example high-frequency RF frequencies may include, but are not limited to, frequencies between 1.8 MHz and 2.45 GHz. In some embodiments, a dual HF/LF RF plasma is employed. Example low-frequency RF frequencies may include, but are not limited to, frequencies between 50 kHz and 500 kHz.

The RF power used to drive plasma generation and film formation may be described in various ways. In some cases, a multi-station reaction chamber is used, in which case there may be multiple RF generators acting on multiple substrates. The RF power levels recited herein reflect the power delivered in a multi-station tool with four stations. Further, the absolute level of RF power delivered, when recited in terms of Watts, relates to the power delivered when processing a 300 mm wafer. The techniques herein may be used to process substrates of any size, and the power levels scale with the area of the substrate. As such, the RF power levels may also be recited in terms of a power density (e.g., power delivered divided by the area of the substrate). The substrate area is calculated as the surface area of the plating face of the substrate, without taking into account any non-planar features. In other words, a 300 mm diameter substrate is considered to have a substrate area of about 707 $cm^2$, regardless of whether there are features present on the surface that would technically increase the surface area above this baseline amount.

In various disclosed embodiments, the power is between about 400 Watts per station and 10 kilowatts per station. In some embodiments, the power is 6 kW distributed over four stations. In some cases, the RF power is between about 1000-3000 Watts per station (between about 1.4-4.3 $W/cm^2$ per station), for example between about 1000-2500 Watts per station (between about 1.4-3.5 $W/cm^2$ per station). In some cases where high RF power is not utilized, however, the RF power may be as low as about 12 Watts/station. Among other benefits, these high RF power levels allow the plasma exposure time to be minimized, thereby reducing processing time and increasing throughput. High RF power may also contribute to improved film uniformity due to activation of reactive sites and increased mobility of species as a result of using sub-saturated levels of a primary reactant.

In some embodiments, a plasma generator may be controlled to provide intermittent pulses of plasma energy during a plasma activation phase. For example, the plasma may be pulsed at one or more frequencies including, but not limited to, frequencies between 10 Hz and 500 Hz. This may enhance step coverage by reducing a directionality of ion bombardment in comparison to a continuous plasma. Further, this may reduce ion bombardment damage to the substrate. For example, photoresist substrates may be eroded by ion bombardment during a continuous plasma. Pulsing the plasma energy may reduce photoresist erosion.

While the SS-ALD process embodiment depicted in FIG. 1 is plasma activated, it will be appreciated that other non-thermal energy sources may be used within the scope of the present disclosure. Non-limiting examples of non-thermal energy sources include, but are not limited to, ultraviolet lamps, downstream or remote plasma sources, inductively-coupled plasmas, and microwave surface wave plasmas.

Any suitable gas may be used to form the plasma. In a first example, and inert gas such as argon or helium may be used to form the plasma. In a second example, a reactant gas such as oxygen or ammonia may be used to form the plasma. In a third example, a sweep gas such as nitrogen may be used to form the plasma. Of course, combinations of these categories of gases may be employed. Ionization of the gas between the plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for SS-ALD processes may be formed by one or more suitable methods other than capacitive coupling of an RF field to a gas Unlike many other deposition processes, particularly those requiring thermal activation, the SS-ALD process may be conducted at a relatively low temperature. Generally, the SS-ALD temperature may be between about 20° C. and about 400° C. Such temperature may be chosen to permit deposition in the context of a temperature sensitive process such as deposition on a photoresist core. In a specific embodiment, a temperature of between about 20° C. and about 100° C. is used for double patterning applications (using, e.g., photoresist cores). In another embodiment, a temperature of between about 200° C. and about 350° C. is employed for memory fabrication processing.

Figure 4B:
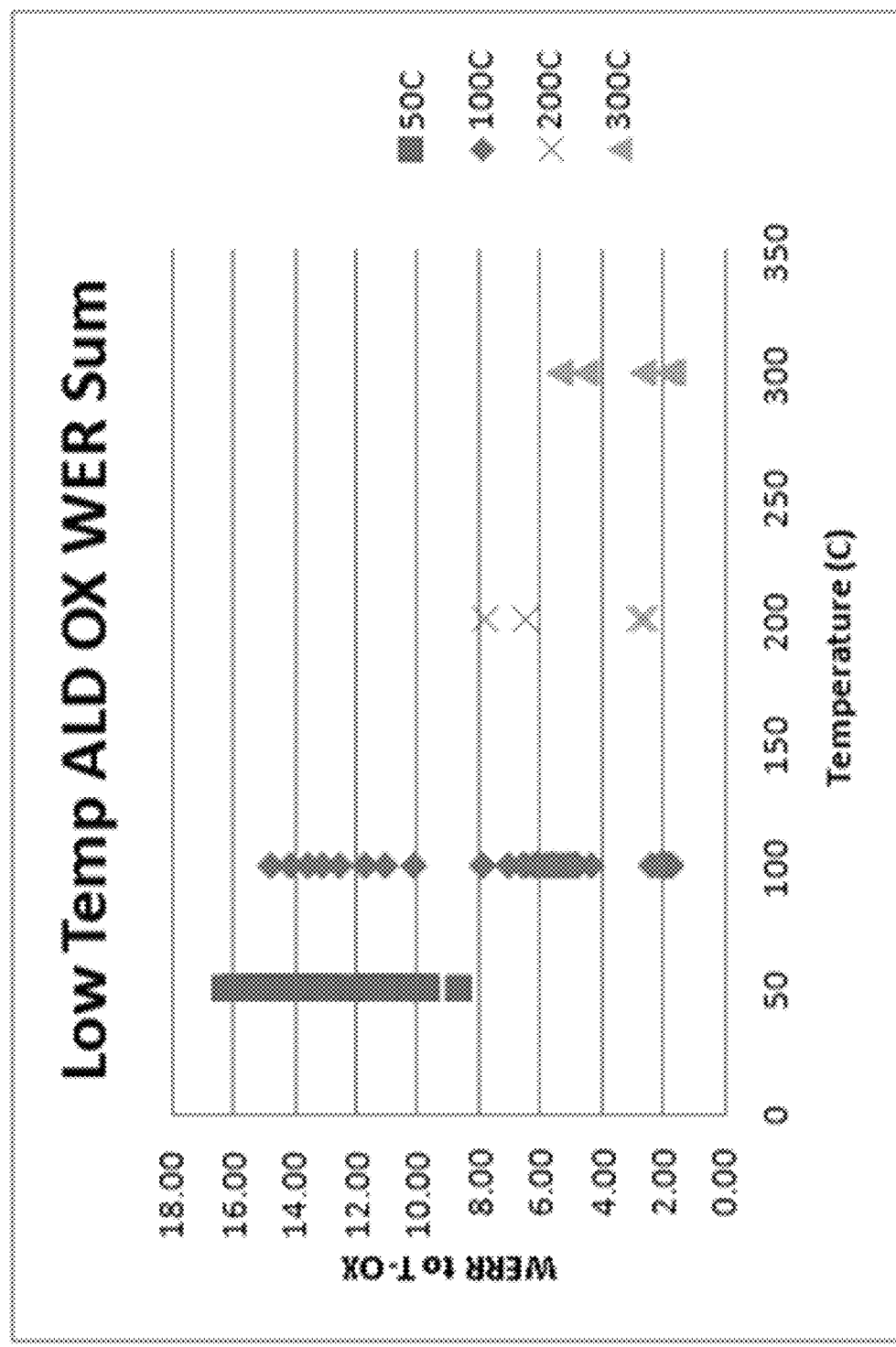
FIG. 4B shows data related to wet etch rate properties of silicon oxide films deposited at various temperatures.

At various temperatures, SS-ALD deposition methods may be used to achieve films of different wet etch rate properties. FIG. 4B shows experimental data depicting various wet etch rates ratio (WERR) to a thermal oxide deposition of films deposited by SS-ALD at a variety of different temperatures. For instance, at 50° C., films with relative wet etch rates of 8.0 to 16.0 are shown, and at a deposition temperature of 100° C., SS-ALD films exhibit wet etch rates at an even wider range from 2.0 to 15.0. This is notable as conventional processes are unable to deposit low WERR films at low temperatures. However, using the SS-ALD methods described herein, films having various WERR can be deposited at a wide range of temperatures using pressure and plasma power to tune the WERR. According to various embodiments, pressure in the reaction chamber during at least plasma activation may be between about 1 Torr and about 100 Torr. This pressure may also be used during the remainder of the cycle. In some cases, an optional pump down to less than about 1 Torr (e.g., using a setpoint of 0) may be employed after the plasma is extinguished, either before, during or after a post-plasma purge if performed. Without being bound by a particular theory, it is believed that films deposited have better performance due to better plasma confinement between the showerhead and the pedestal at high pressures, and reduction of parasitic plasma in remote regions of the chamber. This reduces the likelihood of particles flaking in the remote chamber areas.

Films deposited by SS-ALD can be of any desired thickness, which may be measured by measuring thickness at various points on the wafer and calculating an average thickness over the entire wafer. An SS-ALD cycle thickness may be less than the largest bond length of a desired film because not all reactive sites will have deposited film in any one cycle. SS-ALD films may therefore be thinner than even the thinnest films deposited by conventional ALD or CFD, with thickness tunable to about 0.1 Å. For instance, for a deposition of silicon oxide films using BTBAS, film deposition at less than 0.57 Å/cycle is achieved using SS-ALD in the example shown in Table 1. This thickness is even smaller than the average bond length between Si and O of silicon oxide (1.62 Å). Experimental data collected achieved SS-ALD films with a thickness of about 0.57 Å, 0.71 Å, 0.76 Å, 0.81 Å, 0.9 Å, or 0.97 Å. In one example, the deposited thickness of an SS-ALD film is less than about 1.0 Å. Experiments showed SS-ALD methods could be used to deposit films of about 0.95 Å in thickness by using two cycles of 0.57 Å/cycle layers, thereby using more cycles to deposit the amount that conventional ALD deposits in one cycle. Conditions of temperature and plasma power limited conventional ALD methods to deposition cycles of at least the distance of a bond length per cycle. A comparison of film thicknesses deposited by ALD versus SS-ALD is shown in Table 1.

TABLE 1

Film thicknesses by using saturated ALD v. SS-ALD methods

| Number of Cycles | Film thickness by ALD 0.95 Å/cycle ($SiO_2$ via BTBAS) | Film thickness by SS-ALD 0.57 Å/cycle ($SiO_2$ via BTBAS) |
| --- | --- | --- |
| 1 | 0.95 Å | 0.57 Å |
| 2 | 1.90 Å | 1.14 Å |
| 3 | 2.85 Å | 1.71 Å |
| 4 | 3.80 Å | 2.28 Å |

As shown in Table 1, $SiO_2$ films deposited by ALD using BTBAS at the conventional 0.95 Å/cycle yield thicker films per-cycle than $SiO_2$ films deposited by SS-ALD using BTBAS at 0.57 Å/cycle. Minimum cycle thickness can vary based on the precursor system used. For example, cycle thickness for SS-ALD of silicon oxide using a very starved dose of BTBAS may be as low as 0.4 Å using a particular delivery system and as low 0.1 Å for other ALD metal oxide deposition using the same delivery system. The minimum film cycle thickness may be limited only by the hardware used to supply the dose of the principle reactant.

Continuous film deposition may also be achieved by SS-ALD methods. An unexpected benefit of SS-ALD is reduced within wafer non-uniformity. Although films may not be deposited continuously in any one cycle, in the aggregate, continuous film deposition is achieved due to the nature of repeating SS-ALD cycles. Without being bound by any particular theory, it is believed that during each sub-saturated cycle, precursors react at various dispersed reactive sites, but over time, each cycle results in precursors reacting at remaining reactive sites and in the aggregate, a dense, uniform thin film may be achieved. Further, while the adsorption of the principle reactant is disperse in any one sub-saturated cycle, it is generally uniform across the substrate.

Without being bound by any particular theory, it is also believed that using RF plasma between cycles forms these thin, uniform films deposited by SS-ALD because the RF plasma activates the reactive sites and deposited films, increasing mobility of species to deposit films continuously at a faster rate. The efficiency and conversion of RF activation is greater with a sub-saturated layer than with a saturated layer.

Moreover, without being bound by a particular theory, uniform continuous films may be achieved because parasitic plasma-enhanced chemical vapor deposition (PECVD) imparted by incomplete sweep phase at higher flow is reduced. Since less precursor amount is used in each cycle, less residual precursor needs to be removed, and there is a smaller chance that parasitic PECVD will occur on the substrate.

SS-ALD has many applications. SS-ALD is well suited for depositing films in advanced technology nodes. Thus, for example, SS-ALD processing may be integrated in processes at the 32 nm node, the 22 nm node, the 16 nm node, the 11 nm node, and beyond any of these. These nodes are described in the International Technology Roadmap for Semiconductors (ITRS), the industry consensus on microelectronic technology requirements for many years. Generally they reference one-half pitch of a memory cell. In a specific example, the SS-ALD processing is applied to "2X" devices (having device features in the realm of 20-29 nm) and beyond.

While most examples of SS-ALD films presented herein concern silicon based microelectronic devices, the films may also find application in other areas. Microelectronics or optoelectronics using non-silicon semiconductors such as GaAs and other III-V semiconductors, as well as II-VI materials such as HgCdTe may profit from using the SS-ALD processes disclosed herein. Applications for conformal dielectric films in the solar energy field, such as photovoltaic devices, in the electrochromics field, and other fields are possible.

Other example applications for SS-ALD films include, but are not limited to conformal low-k films (e.g., k approximately 3.0 or lower in some non-limiting examples) for back-end-of-line interconnect isolation applications, conformal silicon nitride films for etch stop and spacer layer applications, conformal antireflective layers, and copper adhesion and barrier layers. Many different compositions of low-k dielectrics for BEOL processing can be fabricated using SS-ALD. Examples include silicon oxides, oxygen doped carbides, carbon doped oxides, oxynitrides, and the like.

In one scenario, an SS-ALD process may deposit a conformal silicon dioxide film on a non-planar substrate. For example, an SS-ALD silicon dioxide film may be used for gap fill of structures, such as a trench fill of shallow trench isolation (STI) structures. While the various embodiments described below relate to a gap fill application, it will be appreciated that this is merely a non-limiting, illustrative application, and that other suitable applications, utilizing other suitable film materials, may be within the scope of the present disclosure. Other applications for SS-ALD silicon dioxide films include, but are not limited to, interlayer dielectric (ILD) applications, intermetal dielectric (IMD) applications, pre-metal dielectric (PMD) applications, dielectric liners for through-silicon via (TSV) applications, resistive RAM (ReRAM) applications, and/or stacked capacitor fabrication in DRAM applications.

Doped silicon oxide may be used as a diffusion source for boron, phosphorus, or even arsenic dopants. For example, a boron doped silicate glass (BSG), a phosphorus doped silicate glass (PSG), or even a boron phosphorus doped silicate glass (BPSG) could be used. Doped SS-ALD layers can be employed to provide conformal doping in, for example, three-dimensional transistor structures such as multi-gate FinFET's and three-dimensional memory devices. Conventional ion implanters cannot easily dope sidewalls, especially in high aspect ratio structures.

SS-ALD doped oxides as diffusion sources have various advantages. First, they provide high conformality at low temperature. In comparison, low-pressure CVD produced doped TEOS (tetraethylorthosilicate) is known but requires deposition at high temperature, and sub-atmospheric CVD and PECVD doped oxide films are possible at lower temperature but have inadequate conformality. Conformality of doping is important, but so is conformality of the film itself, since the film typically is a sacrificial application and will then need to be removed. A non-conformal film typically faces more challenges in removal, i.e. some areas can be overetched.

Additionally, SS-ALD provides extremely well controlled doping concentration. As mentioned, an SS-ALD process can provide from a few layers of undoped oxide followed by a single layer of doping. The level of doping can be tightly controlled by the frequency with which the doped layer is deposited and the conditions of the doping cycle. In certain embodiments, the doping cycle is controlled by for instance using a dopant source with significant steric hindrance. In addition to conventional silicon-based microelectronics, other applications of SS-ALD doping include microelectronics and optoelectronics based on III-V semiconductors such as GaAs and II-VI semiconductors such as HgCdTe, photovoltaics, flat panel displays, and electrochromic technology.

While the various SS-ALD deposition processes described above have been directed at depositing, treating, and/or etching single film types, it will be appreciated that some SS-ALD processes within the scope of the present disclosure may include in-situ deposition of a plurality of film types. For example, alternating layers of film types may be deposited in-situ. In a first scenario, a double spacer for a gate device may be fabricated by in-situ deposition of a silicon nitride/silicon oxide spacer stack. This may reduce cycle time and increase process station throughput, and may avoid interlayer defects formed by potential film layer incompatibility. In a second scenario, an antireflective layer for lithographic patterning applications may be deposited as a stack of SiON or amorphous silicon and SiOC with tunable optical properties.

EXPERIMENTAL

Silicon oxide films were deposited by conventional CFD processes as shown below in Table 2 in CFD Process A.

TABLE 2

Conventional CFD v. SS-ALD by Varying BTBAS Flow for a 2000 Å Film on 300 mm Wafer

| Process | | CFD Process A | SS-ALD Process A | SS-ALD Process B | SS-ALD Process C | SS-ALD Process D |
|---|---|---|---|---|---|---|
| Flow Rate (mL/min) | | 2.0 | 1.5 | 1.0 | 0.5 | 0.5 |
| Process Cycle Time | dose | 0.3 s | 0.3 s | 0.3 s | 0.3 s | 0.2 s |
| | purge | 0.3 s | 0.3 s | 0.3 s | 0.3 s | 0.2 s |
| | dose | 0.25 s | 0.25 s | 0.25 s | 0.25 s | 0.15 s |
| | post-RF purge | 0.09 s | 0.09 s | 0.09 s | 0.09 s | 0.09 s |
| Amount of BTBAS Used Per 2000 Å Film of SiO2 on a 300 mm Wafer | | 13.5 g | 10.125 g | 6.7 g | 3.38 g | 2.83 g |
| Throughput (wph) | | | 6.5 | 6.1 | 5.4 | 7.0 |

Oxygen was continuously flowed into the chamber. The precursor, BTBAS, was intermittently flowed at a flow rate of 2 mL/min for a 0.3 second dose, followed by a 0.3 second purge, a 0.25 second RF plasma power phase, and 0.09 second post-RF purge. The amount of BTBAS used for a 2000 Å wafer was 13.5 g.

To compare, four trial processes were done to deposit silicon oxide films using SS-ALD. Oxygen was continuously flowed into the chamber for all four processes. Like the CFD Process A, in SS-ALD Process A, B, C, and D, BTBAS was intermittently flowed for a 0.3 second dose, followed by a 0.3 second purge, then a 0.25 second RF plasma power phase, and a 0.09 second post-RF purge.

In SS-ALD Process A, the flow rate of BTBAS was 1.5 mL/min and the total amount of BTBAS used for a 2000 Å wafer was 10.125 g, which was less than the amount used in CFD Process A. Throughput was measured at 6.5 wafers per hour (wph). In SS-ALD Process B, the flow rate of BTBAS was lowered yet to 1.0 mL/min, and a total of 6.7 g of BTBAS was used. Throughput lowered to 6.1 wph. In SS-ALD Process C, the flow rate of BTBAS was lowered again to 0.5 mL/min, which used a total of only 3.38 g of BTBAS. Throughput decreased to 5.4 wph.

In SS-ALD Process D, the flow rate was the same as in SS-ALD Process C of 0.5 mL/min, but the dose time was decreased to 0.2 seconds, the purge time decreased to 0.2 seconds, and the RF plasma power time decreased to only 0.15 seconds. The result was a substantial decrease in chemical use of 2.83 g, and a significantly notable increase in throughput of 7.0 wph.

As shown by the data in Table 2, deposition by SS-ALD methods may use less precursor overall since less is used per cycle. Such deposition may also result in improved throughput. When sweep time was decreased in SS-ALD Process D, wafer throughput was substantially increased.

In another series of experiments, throughput was measured for various processes where films were deposited by SS-ALD with a shortened post-dose purge or RF power on time. Results of these experiments are shown below in Table 3.

For methods involving a BTBAS flow rate of 1 mL/min, a film was deposited by conventional CFD with a post-dose purge time of 0.3 seconds and an RF plasma on time of 0.25 seconds. The deposition rate was 0.86 Å/cycle with an overall throughput of over 6.0 wph. Nonuniformity was at 1.45% for 540 cycles/station.

A film was deposited using SS-ALD at the same flow rate, but with a post-dose purge time of 0.2 seconds. RF plasma time was the same as CFD Process 1, and throughput did not change substantially. Nonuniformity was at 1.47% without a substantial change. A film was deposited using SS-ALD at the same flow rate, but with both a post-dose purge time decreased to 0.2 seconds and an RF plasma time reduced to 0.15 seconds. The deposition rate was 0.9 Å/cycle, and throughput was still over 6.0 wph. Meanwhile, nonuniformity decreased to 1.36%.

In another series of experiments, BTBAS was flowed at 0.5 mL/min. A film was deposited by conventional CFD at a post-dose purge time of 0.3 seconds, an RF plasma on time of 0.25 seconds, and a deposition rate of 0.76 Å/cycle. Throughput was 5.4 wph, and nonuniformity was at 1.03%.

A film was deposited using SS-ALD using that same flow rate of 0.5 mL/min, and post-dose purge time was decreased to 0.2 seconds, RF plasma on time remained at 0.25 seconds, and deposition rate was 0.76 Å/cycle. Throughput was 6.0 wph and nonuniformity was at 1.12%. Lastly, a film was deposited using SS-ALD with a decreased post-dose purge time at 0.2 seconds, decreased RF plasma on time of 0.15 seconds, and deposition rate of 0.79 Å/cycle. Throughput increased to 7.0 wph with a substantially notable nonuniformity of 0.85%.

These results suggest SS-ALD processes reduce chemical usage, provide superior within-wafer uniformity, and reduce defect counts possibly due to reduced parasitic PECVD and/or greater RF activation per adsorbed molecule. Chemical flow reduction also improved throughput, possibly due to reduced purge time.

Experiments were made to measure wet etch rate ratios to thermal oxide at various temperatures. The results are shown in Table 4.

TABLE 3

Conventional CFD v. SS-ALD by Varying Post-Dose Purge or Plasma Time for a 2000 Å Film on a 300 mm Wafer

| | BTBAS Flow Rate | | | | | |
|---|---|---|---|---|---|---|
| | 1 mL/min | | | 0.5 mL/min | | |
| | Process | | | | | |
| | CFD Process 1 | SS-ALD Process 1 | SS-ALD Process 2 | CFD Process 2 | SS-ALD Process 3 | SS-ALD Process |
| Post-Dose Purge Time (seconds) | 0.3 | 0.2 | 0.2 | 0.3 | 0.2 | 0.2 |
| RF Plasma Time (seconds) | 0.25 | 0.25 | 0.15 | 0.25 | 0.25 | 0.15 |
| Deposition Rate (Å/cycle) | 0.86 | 0.86 | 0.9 | 0.76 | 0.76 | 0.79 |
| Throughput (wph) | >6.0 | >6.0 | >6.0 | 5.4 | 6.0 | 7.0 |
| Nonuniformity % (for 540 cycles/station) | 1.45 | 1.47 | 1.36 | 1.03 | 1.12 | 0.85 |

TABLE 4

Conversion Efficiency and Wet Etch Rate Ratios for Conventional CFD v. SS-ALD

| | Temperature | | | | | |
|---|---|---|---|---|---|---|
| | 400° C. | | | | 200° C. | |
| Deposition | CFD | SS-ALD | CFD | SS-ALD | CFD | SS-ALD |
| Dose flow (mL/min) | 2 | 2 | 0.5 | 2 | 1 | 0.4 | 2 | 0.4 |
| Dose time (s) | 0.3 | 0.3 | 0.3 | 0.2 | 0.2 | 0.2 | 0.2 | 0.2 |
| Precursor flux per dose (micro-liters) | 10 | 10 | 2.5 | 6.7 | 3.3 | 1.3 | 6.7 | 1.3 |
| RF energy/station (J) | 250 | 375 | 375 | 300 | 300 | 300 | 300 | 300 |
| Conversion efficiency (Joule/mL) | 25 | 37.5 | 150 | 45 | 90 | 225 | 45 | 225 |
| Growth rate | 0.82 | 0.86 | 0.68 | 0.75 | 0.68 | 0.63 | 0.9 | 0.77 |
| Wet etch rate ratio to thermal oxide | 1.63 | 1.5 | 1.44 | 1.51 | 1.45 | 1.31 | 2.94 | 2.68 |
| Wet etch rate (A/min) | 48.9 | 45 | 43.2 | 45.3 | 43.5 | 39.3 | 88.2 | 80.4 |

Figure 4C:
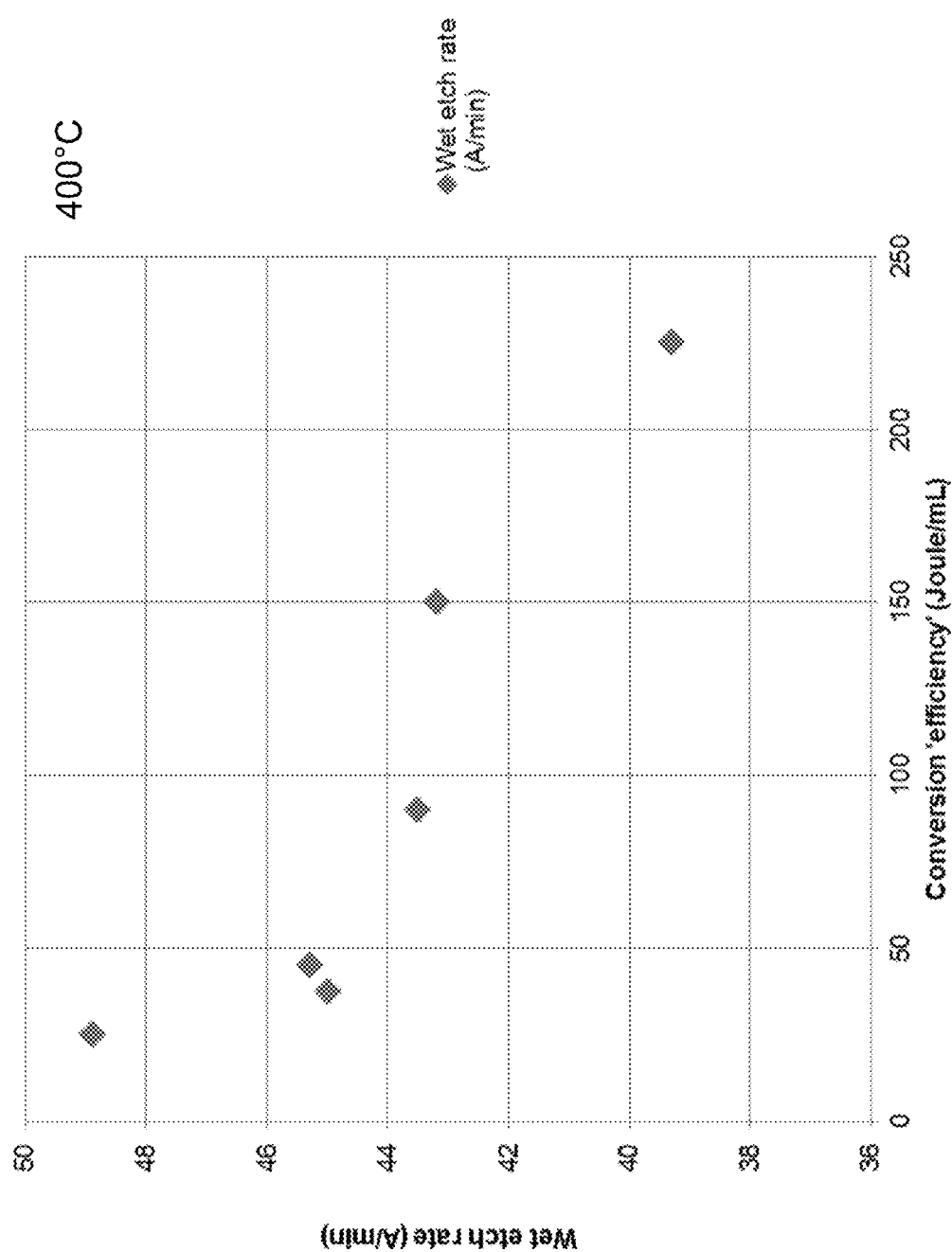
FIG. 4C shows data related to wet etch rate and conversion efficiency for films deposited at 400° C.
Figure 4D:
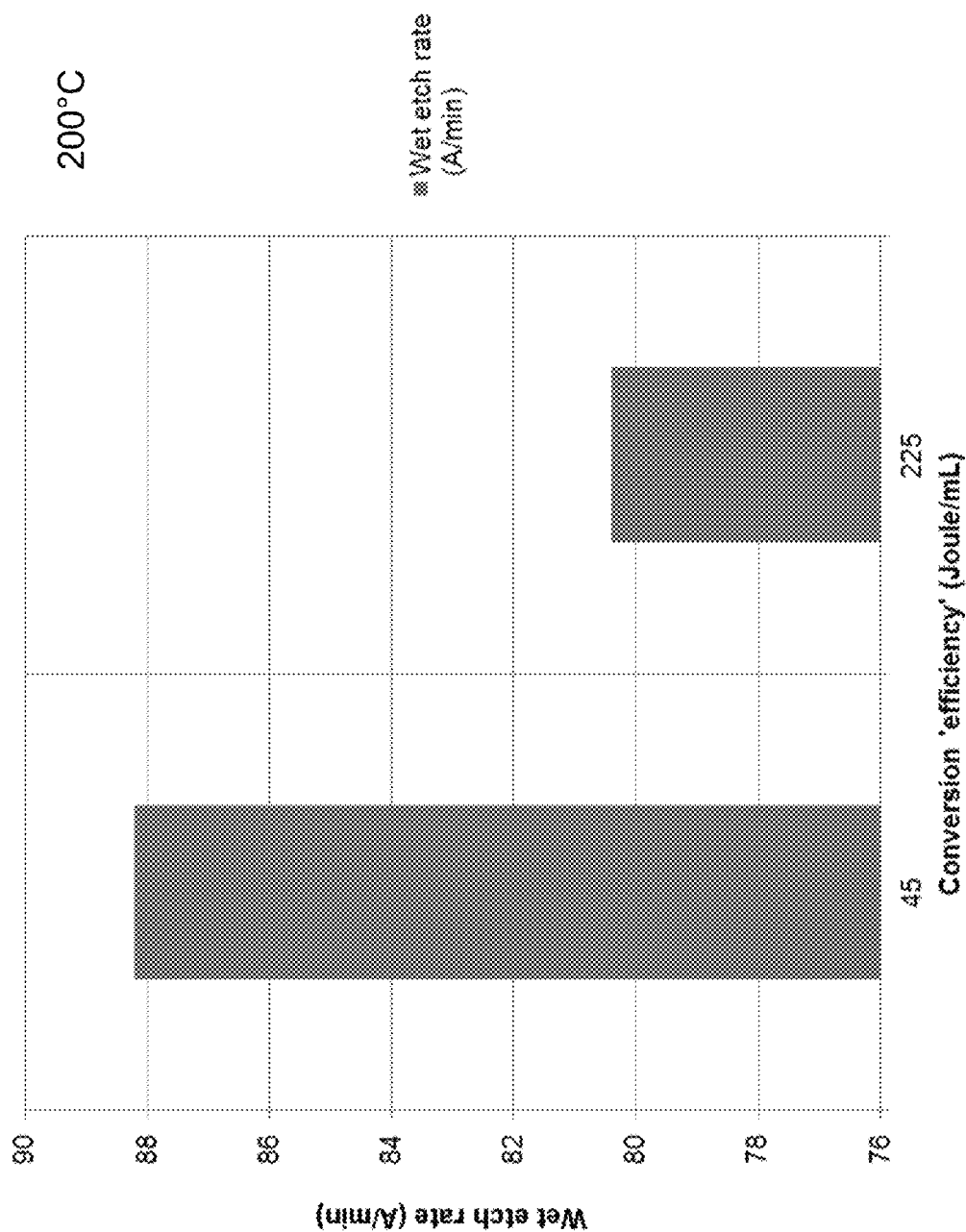
FIG. 4D shows data related to wet etch rate and conversion efficiency for films deposited at 200° C.

Conversion efficiency is the RF energy applied per station per unit of precursor flux in a dose. Conventional CFD was used at 400° C. for a precursor flux per dose of 10 micro-liters, as shown by the first two data columns of Table 4. The approximate saturation dose for the precursor used was 4 microliters, which represents the precursor flux per dose. As shown above, the wet etch rate ratio to thermal oxide improved by 9% to 14% for high energy RF power by using sub-saturated methods. These results for both conventional and sub-saturated ALD methods at both 400° C. and 200° C. are shown in FIGS. 4C and 4D. Note that since wet etch rate decreases as conversion efficiency increases, both the decreased precursor flux and the change in RF activation affect the improved performance of continuous thin films deposited by SS-ALD. Conversion efficiency may be at least 45 J/mL, or at least 100 J/mL, or at least 200 J/mL. In some embodiments, conversion efficiency may be at least 225 J/mL.

Figure 4E:
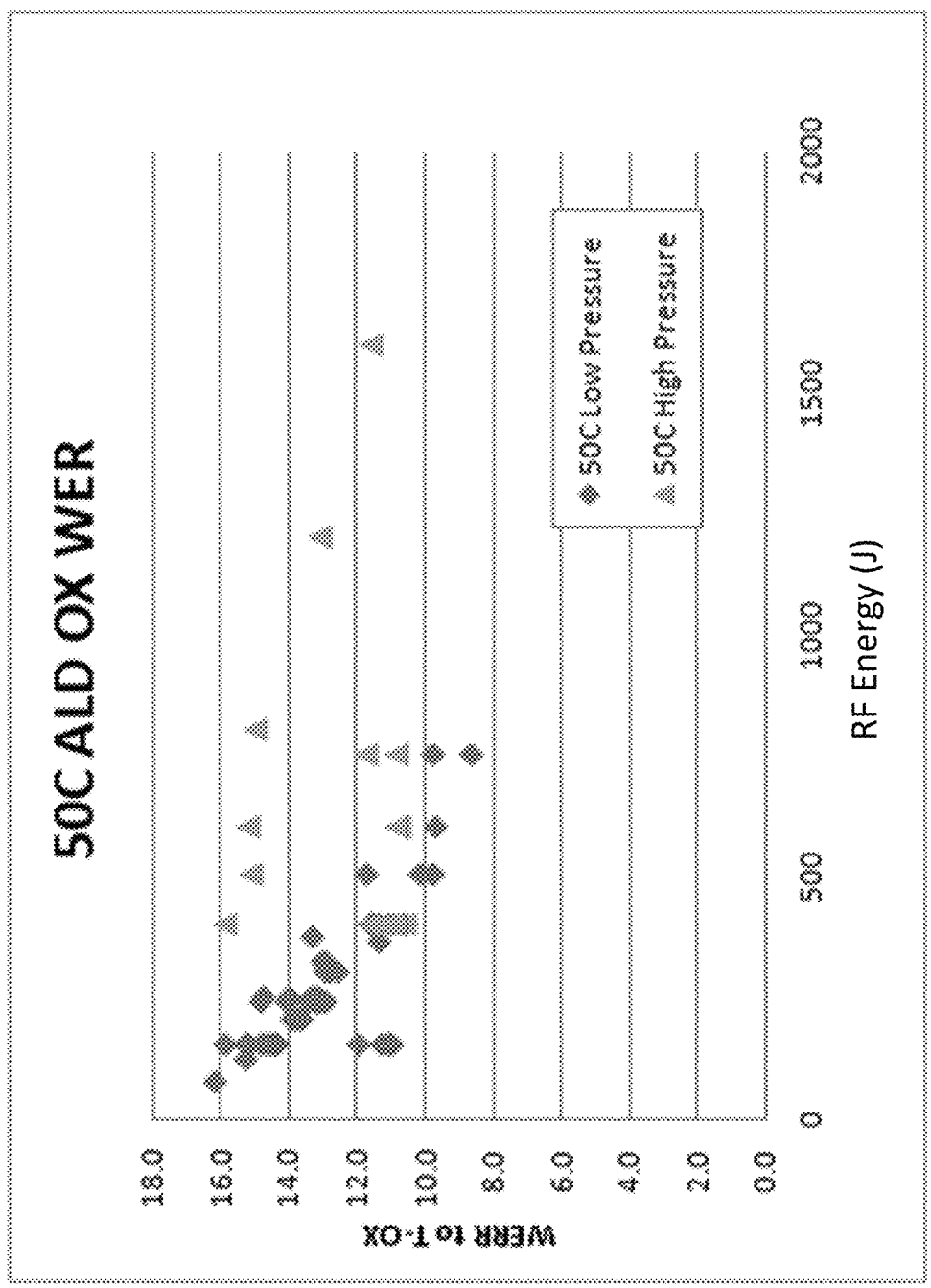
FIG. 4E shows data related to wet etch rate ratios to thermal oxide and high radio frequency energy for films deposited at 50° C. while varying pressure.

Experiments were conducted to determine the effect of modulating pressure and RF energy in thin films deposited by SS-ALD. The results are shown in FIG. 4E. RF Energy was calculated by multiplying RF power by the time the RF power was on. Deposition by low pressure at 50° C. achieved a wide range of wet etch rate ratios to thermal oxide with modulated RF energy. The wet etch rate range is also wide for SS-ALD at 50° C. and high pressure, ranging from 8.0 to 16.0. Thus, RF power may be tuned to the desired wet etch rate. A higher total RF energy resulted in lower wet etch rate, suggesting that RF activation on the surface of the substrate contributes to forming dense, continuous thin films by SS-ALD.

Figure 4F:
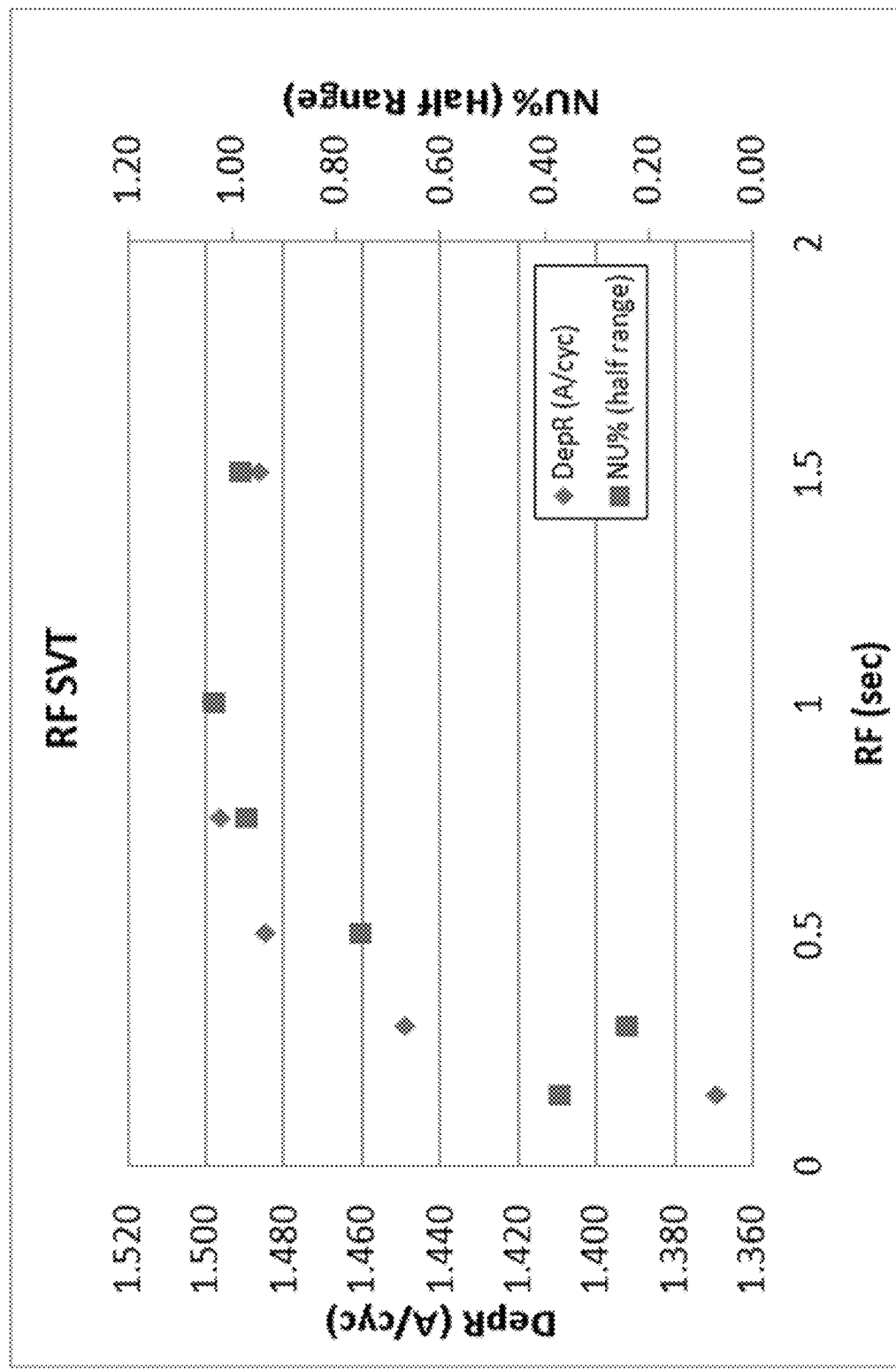
FIG. 4F shows data related to deposition rate and nonuniformity using various RF plasma on times.

Single variable test (SVT) experiments were conducted to determine the deposition rate and non-uniformity percent based on RF plasma exposure time and purge time at RF power of 800 W. The results are shown in FIG. 4F. As shown, deposition rate stabilizes at RF power on for 0.5 seconds, suggesting that by using a 0.5 second RF power, all sub-saturated deposition is fully converted. Non-uniformity at 0.3 seconds is at a low of 0.28%, indicating a smooth, uniform film was deposited. Within-wafer non-uniformity may be calculated by a number of different methods; half-range uniformity is calculated as (max-min)/(2*mean).

Figure 4G:
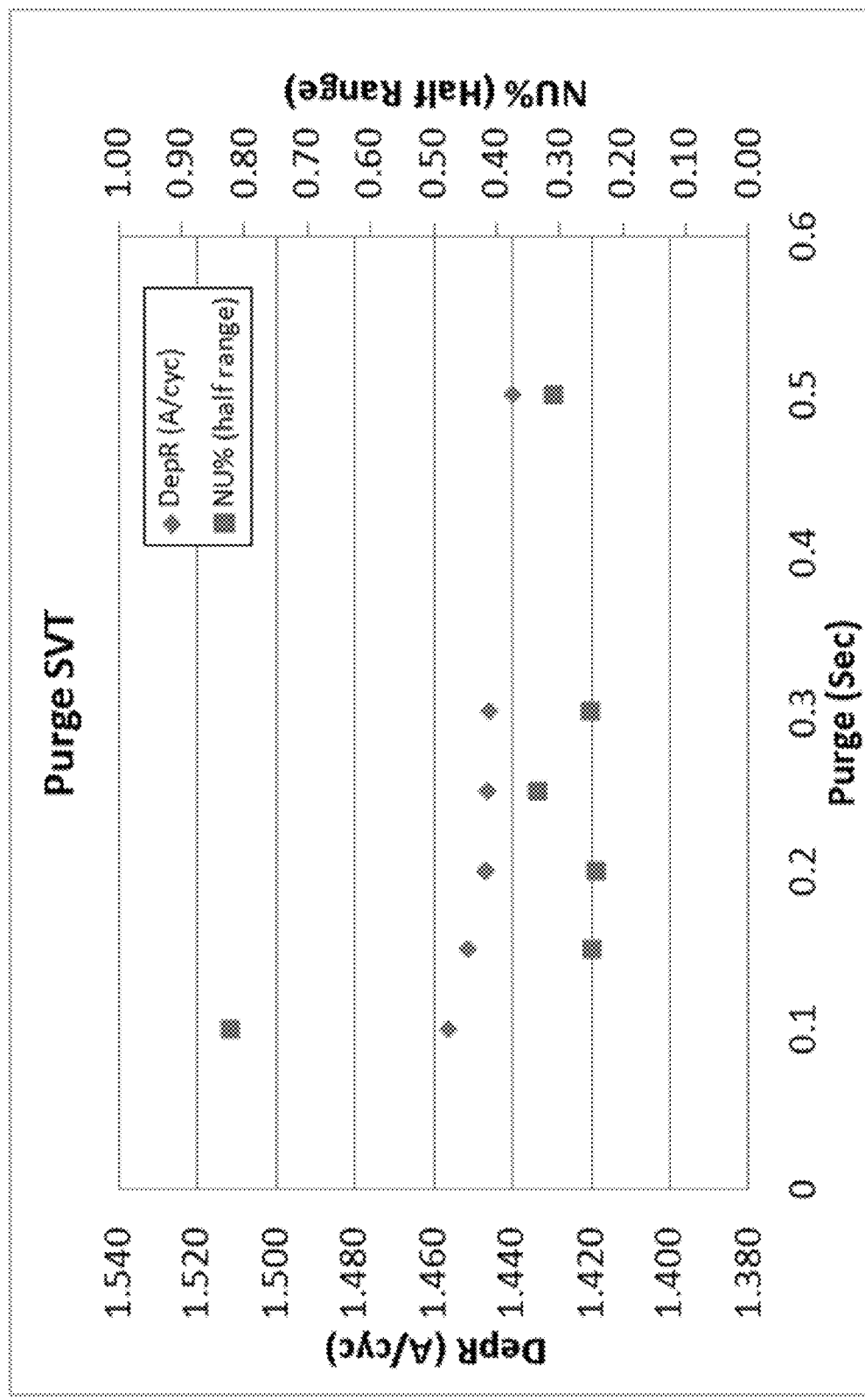
FIG. 4G shows data related to deposition rate and nonuniformity using various post-dose purge times.

The results for RF purge time are shown in FIG. 4G. The figure indicates that deposition rate was stable after a 0.15 second purge, suggesting that a 0.15 second purge is sufficient to clear out any residual precursor, thereby reducing purge time and increasing throughput. Nonuniformity was stable after a 0.15 second purge, coinciding with the optimal minimized purge time.

Apparatus

Figure 5:
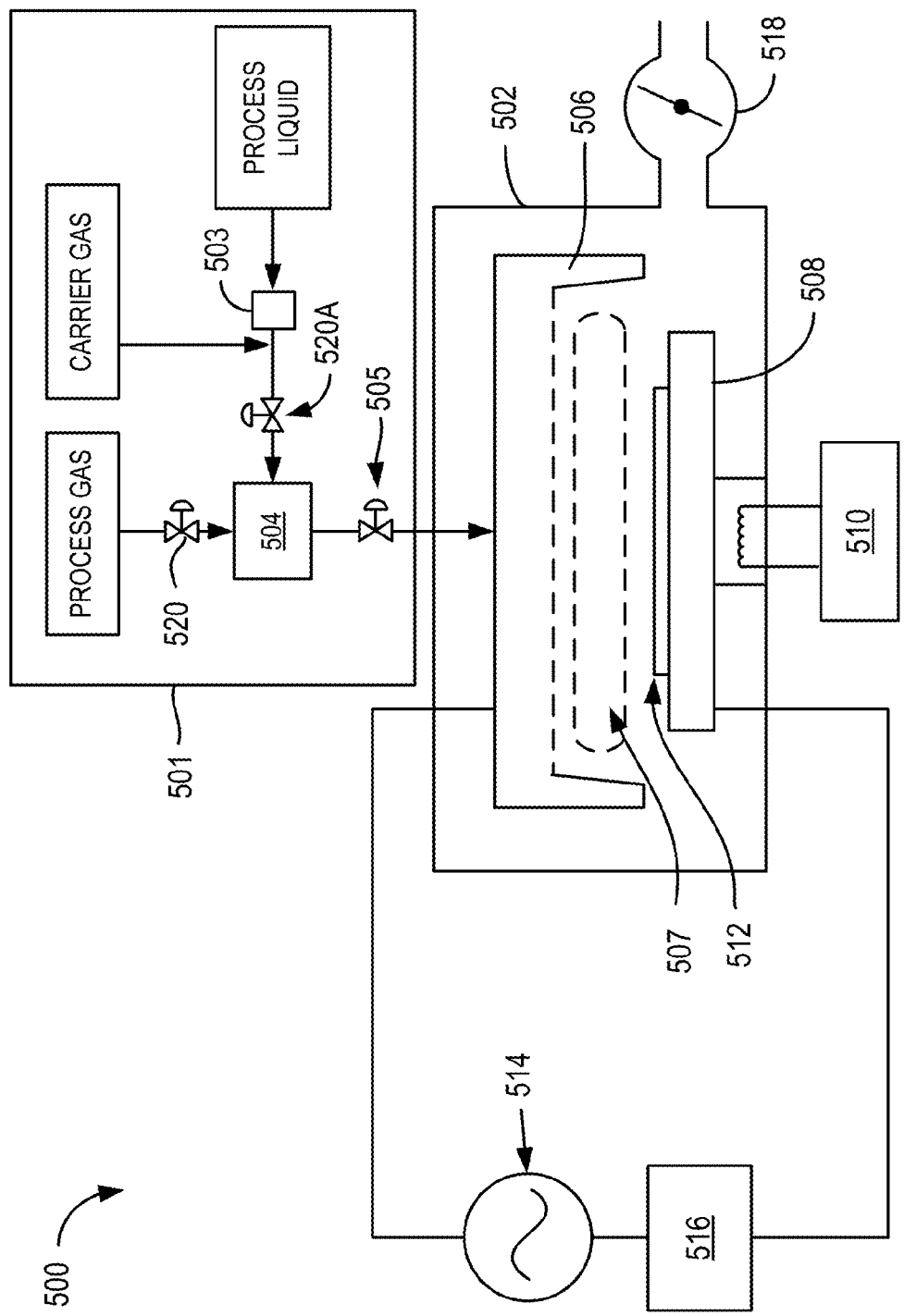
FIG. 5 schematically shows an example process tool including a plurality of process stations and a controller according to an embodiment of the present disclosure.
Figure 6:
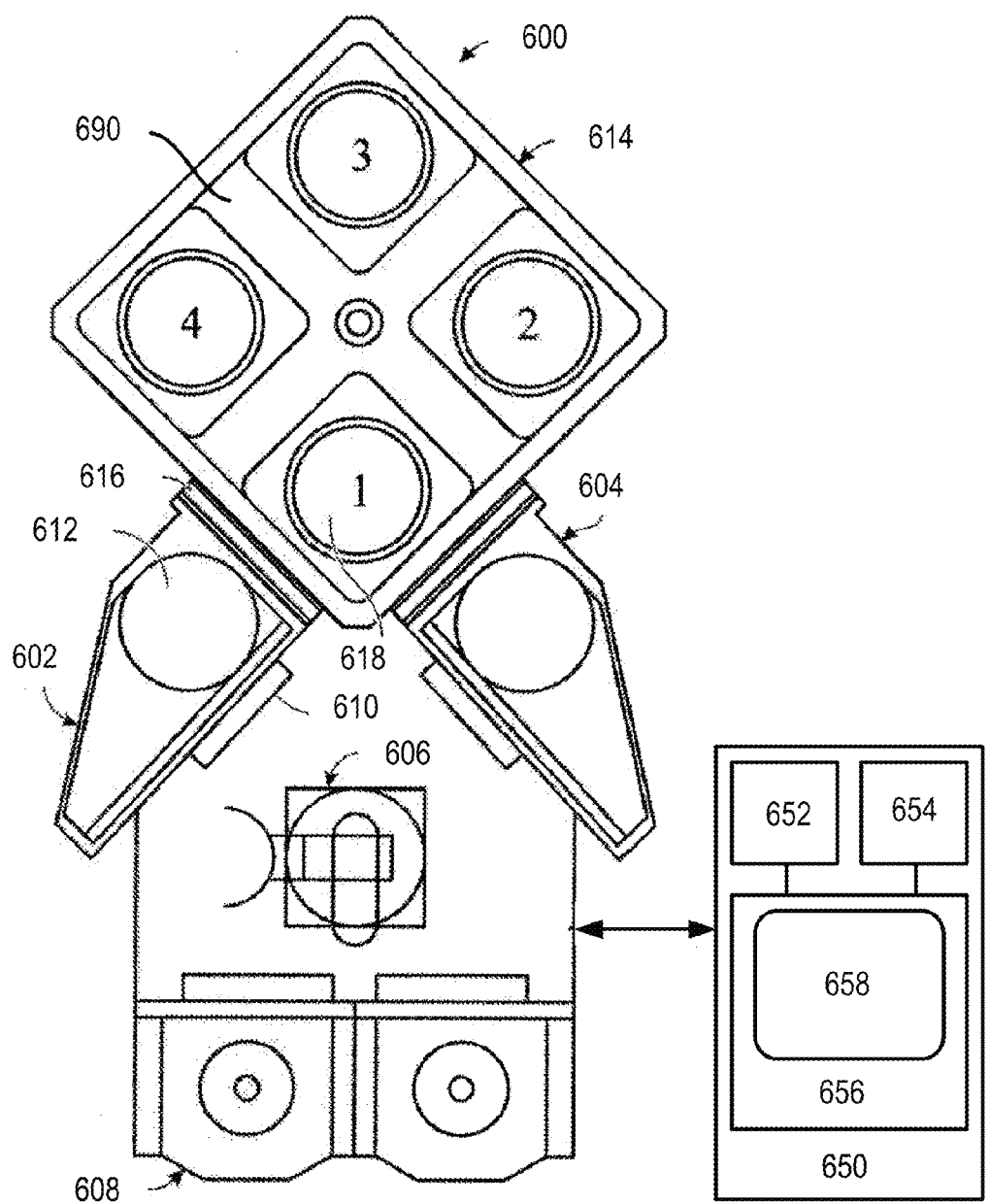
FIG. 6 schematically shows an example process station according to an embodiment of the present disclosure.

It will be appreciated that any suitable process station may be employed with one or more of the embodiments described above. For example, FIG. 5 schematically shows an embodiment of an SS-ALD process station 500. For simplicity, SS-ALD process station 500 is depicted as a standalone process station having a process chamber body 502 for maintaining a low-pressure environment. However, it will be appreciated that a plurality of SS-ALD process stations 500 may be included in a common process tool environment. For example, FIG. 6 depicts an embodiment of a multi-station processing tool 600. Further, it will be appreciated that, in some embodiments, one or more hardware parameters of SS-ALD process station 500, including those discussed in detail below, may be adjusted programmatically by one or more computer controllers.

SS-ALD process station 500 fluidly communicates with reactant delivery system 501 for delivering process gases to a distribution showerhead 506. Reactant delivery system 501 includes a mixing vessel 504 for blending and/or conditioning process gases for delivery to showerhead 506. One or more mixing vessel inlet valves 520 may control introduction of process gases to mixing vessel 504.

Some reactants, like BTBAS, may be stored in liquid form prior to vaporization at and subsequent delivery to the process station. For example, the embodiment of FIG. 5 includes a vaporization point 503 for vaporizing liquid reactant to be supplied to mixing vessel 504. In some embodiments, vaporization point 503 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 503 may be heat traced. In some examples, mixing vessel 504 may also be heat traced. In one non-limiting example, piping downstream of vaporization point 503 has an increasing temperature profile extending from approximately 100 degrees Celsius to approximately 150 degrees Celsius at mixing vessel 504.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller upstream of vaporization point 503 may be provided for controlling a mass flow of liquid for vaporization and delivery to process station 500. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 506 distributes process gases toward substrate 512. In the embodiment shown in FIG. 5, substrate 512 is located beneath showerhead 506, and is shown resting on a pedestal 508. It will be appreciated that showerhead 506 may have any suitable shape, and may have any suitable number and arrangement of ports for distributing processes gases to substrate 512.

In some embodiments, a microvolume 507 is located beneath showerhead 506. Performing an SS-ALD process in a microvolume rather than in the entire volume of a process station may reduce reactant exposure and sweep times, may reduce times for altering SS-ALD process conditions (e.g., pressure, temperature, etc.), may limit an exposure of process station robotics to process gases, etc. Example microvolume sizes include, but are not limited to, volumes between 0.1 liter and 2 liters. This also impacts productivity throughput. While deposition rate per cycle drops in SS-ALD, the cycle time also simultaneously reduces. In certain cases, the effect of the latter is dramatic enough to improve overall throughput of the module for a given target thickness of film.

In some embodiments, pedestal 508 may be raised or lowered to expose substrate 512 to microvolume 507 and/or to vary a volume of microvolume 507. For example, in a substrate transfer phase, pedestal 508 may be lowered to allow substrate 512 to be loaded onto pedestal 508. During an SS-ALD process phase, pedestal 508 may be raised to position substrate 512 within microvolume 507. In some embodiments, microvolume 507 may completely enclose substrate 512 as well as a portion of pedestal 508 to create a region of high flow impedance during an SS-ALD process.

Optionally, pedestal 508 may be lowered and/or raised during portions the SS-ALD process to modulate process pressure, reactant concentration, etc., within microvolume 507. In one scenario where process chamber body 502 remains at a base pressure during the SS-ALD process, lowering pedestal 508 may allow microvolume 507 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 508 may allow a plasma density to be varied during plasma activation and/or treatment cycles included in the SS-ALD process. At the conclusion of the SS-ALD process phase, pedestal 508 may be lowered during another substrate transfer phase to allow removal of substrate 512 from pedestal 508.

While the example microvolume variations described herein refer to a height-adjustable pedestal, it will be appreciated that, in some embodiments, a position of showerhead 506 may be adjusted relative to pedestal 508 to vary a volume of microvolume 507. Further, it will be appreciated that a vertical position of pedestal 508 and/or showerhead 506 may be varied by any suitable mechanism within the scope of the present disclosure. In some embodiments, pedestal 508 may include a rotational axis for rotating an orientation of substrate 512. It will be appreciated that, in some embodiments, one or more of these example adjustments may be performed programmatically by one or more suitable computer controllers.

Returning to the embodiment shown in FIG. 5, showerhead 506 and pedestal 508 electrically communicate with RF power supply 514 and matching network 516 for powering a plasma. In some embodiments, the plasma energy may be controlled by controlling one or more of a process station pressure, a gas concentration, an RF source power, an RF source frequency, and a plasma power pulse timing. For example, RF power supply 514 and matching network 516 may be operated at any suitable power to form a plasma having a desired composition of radical species. Examples of suitable powers are included above. Likewise, RF power supply 514 may provide RF power of any suitable frequency. In some embodiments, RF power supply 514 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a SS-ALD process recipe. In some cases, process recipe phases may be sequentially arranged, so that all instructions for a SS-ALD process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In conventional deposition processes, plasma strikes last on the order of a few seconds or more in duration. In various implementations described herein, much shorter plasma strikes are applied during a SS-ALD cycle. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with SS-ALD cycles.

In some embodiments, pedestal 508 may be temperature controlled via heater 510. Further, in some embodiments, pressure control for SS-ALD process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to SS-ALD process station 500.

As described above, one or more process stations may be included in a multi-station processing tool. FIG. 6 shows a schematic view of an embodiment of a multi-station processing tool 600 with an inbound load lock 602 and an outbound load lock 604, either or both of which may comprise a remote plasma source. A robot 606, at atmospheric pressure, is configured to move wafers from a cassette loaded through a pod 608 into inbound load lock 602 via an atmospheric port 610. A wafer is placed by the robot 606 on a pedestal 612 in the inbound load lock 602, the atmospheric port 610 is closed, and the load lock is pumped down. Where the inbound load lock 602 comprises a remote plasma source, the wafer may be exposed to a remote plasma treatment in the load lock prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted in FIG. 6 includes load locks, it will be appreciated that, in some embodiments, direct entry of a wafer into a process station may be provided.

The depicted processing chamber 614 comprises four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. For example, in some embodiments, a process station may be switchable between a CFD and PECVD process mode. Additionally or alternatively, in some embodiments, processing chamber 614 may include one or more matched pairs of CFD and PECVD process stations. While the depicted processing chamber 614 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 depicts an embodiment of a wafer handling system 690 for transferring wafers within processing chamber 614. In some embodiments, wafer handling system 690 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog and/or digital input/output connections, stepper motor controller boards, etc.

In some embodiments, system controller 650 controls all of the activities of process tool 600. System controller 650 executes system control software 658 stored in mass storage device 654, loaded into memory device 656, and executed on processor 652. System control software 658 may include instructions for controlling the timing, mixture of gases, amount of sub-saturated gas flow, chamber and/or station pressure, chamber and/or station temperature, wafer temperature, target power levels, RF power levels, substrate pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes. System control software 658 may be coded in any suitable computer readable programming language.

In some embodiments, system control software 658 may include input/output control (IOC) sequencing instructions for controlling the various parameters described above. For example, each phase of a SS-ALD process may include one or more instructions for execution by system controller 650. The instructions for setting process conditions for a SS-ALD process phase may be included in a corresponding SS-ALD recipe phase. In some embodiments, the SS-ALD recipe phases may be sequentially arranged, so that all instructions for a SS-ALD process phase are executed concurrently with that process phase.

Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

An appropriate apparatus for performing the methods disclosed herein is further discussed and described in U.S. patent application Ser. No. 13/084,399, filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entirety.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

What is claimed is:

1. A method for depositing a conformal film on a substrate surface, the method comprising:
    providing a substrate comprising topographical features in a reaction chamber;
    introducing a first reactant in vapor phase into the reaction chamber under conditions allowing the first reactant to adsorb onto the substrate surface;
    introducing a dose of a second reactant in vapor phase into the reaction chamber for a dose time wherein the dose of the second reactant is a sub-saturated dose; and
    periodically exposing the substrate surface to plasma when the dose of the second reactant has ceased to drive a surface reaction between the first and second reactants on the substrate surface to form the film such that it conforms to the topographical features.

2. The method of claim 1, wherein the plasma is ignited while at least one of the reactants is in a gas phase while being exposed to the substrate.

3. The method of claim 1, wherein deposition temperature is less than about 200° C.

4. The method of claim 1, wherein deposition temperature is less than about 150° C.

5. The method of claim 1, wherein the plasma exposure has a conversion efficiency of at least 50 J/mL, wherein the conversion efficiency is the amount of plasma energy applied per unit of second reactant flux in the sub-saturated dose.

6. The method of claim 1, wherein the plasma exposure has a conversion efficiency of at least 150 J/mL, wherein the conversion efficiency is the amount of plasma energy applied per unit of second reactant flux in the sub-saturated dose.

7. The method of claim 1, wherein the first reactant is an oxidant.

8. The method of claim 1, further comprising:
prior to introducing the dose of the second reactant, determining a saturated dose of the second reactant via a dose saturation curve.

9. The method of claim 1, wherein the sub-saturated dose is less than about 4 microliters of the second reactant.

10. The method of claim 1, wherein the sub-saturated dose is less than about 60% of a saturated dose.

11. The method of claim 1, prior to exposing the substrate to plasma, further comprising purging out residual second reactant in vapor phase for a purge time,
wherein the ratio of the purge time to sub-saturated dose time is less than about 2.

12. The method of claim 1, wherein the second reactant is a precursor molecule with a surrounding atom molecular weight of at least 50 Da.

13. The method of claim 1, wherein the second reactant is a precursor molecule with a surrounding atom molecular weight of at least 140 Da.

14. The method of claim 1, wherein the film is deposited is less than about 0.5 Å thick.

15. The method of claim 1, wherein the film is deposited is less than about 0.1 Å thick.

16. The method of claim 1, wherein the film has a within wafer non-uniformity of less than 1.0%.

17. A method for depositing a conformal film on a substrate surface, the method comprising:
providing a substrate comprising topographical features in a station of a single or multi-station reaction chamber;
introducing a first reactant in vapor phase into the chamber under conditions allowing the first reactant to adsorb onto the substrate surface;
introducing a dose of a second reactant in vapor phase into the reaction chamber wherein the dose of the second reactant is a sub-saturated dose; and
periodically exposing the substrate surface to plasma when the dose of the second reactant has ceased to drive a surface reaction between the first and second reactants on the substrate surface to form the film such that it conforms to the topographical features,
wherein the plasma is generated at an energy of at least about 200 Joules per chamber.

18. The method of claim 17, wherein deposition temperature is less than about 150° C.

19. The method of claim 17, further comprising:
prior to introducing the dose of the second reactant, determining the dose of the second reactant via a dose saturation curve.

20. The method of claim 17, wherein the plasma exposure has a conversion efficiency of at least 50 J/mL.

21. The method of claim 17, wherein the film is deposited is less than about 0.1 Å thick.

22. An apparatus for depositing conformal films on a substrate comprising topographical features, the apparatus comprising:
a reaction chamber;
an inlet port for delivering gas phase reactants to the reaction chamber;
a plasma generator for providing plasma to the reaction chamber; and
a controller comprising instructions for:
flowing a first reactant in vapor phase into the reaction chamber under conditions allowing the first reactant to adsorb onto the substrate surface;
flowing a dose of a second reactant in vapor phase into the reaction chamber for a dose time wherein the dose of the second reactant is a sub-saturated dose; and
periodically supplying a plasma in the reaction chamber at a conversion efficiency of at least 50 J/mL when the dose of the second reactant has ceased to drive a surface reaction between the first and second reactants on the substrate surface to form the film such that it conforms to the topographical features,
wherein the conversion efficiency is the amount of plasma energy applied per unit of second reactant flux in the sub-saturated dose.

* * * * *